(12) United States Patent
Myers

(10) Patent No.: US 8,045,598 B2
(45) Date of Patent: Oct. 25, 2011

(54) CONTROLLING POWER IN A SPREAD SPECTRUM SYSTEM

(75) Inventor: Theodore J. Myers, San Diego, CA (US)

(73) Assignee: On-Ramp Wireless, Inc., San Diego, CA (US)

( * ) Notice: Subject to any disclaimer, the term of this patent is extended or adjusted under 35 U.S.C. 154(b) by 0 days.

(21) Appl. No.: 12/816,783

(22) Filed: Jun. 16, 2010

(65) Prior Publication Data

US 2010/0246458 A1    Sep. 30, 2010

Related U.S. Application Data

(63) Continuation of application No. 12/751,724, filed on Mar. 31, 2010, which is a continuation-in-part of application No. 12/189,609, filed on Aug. 11, 2008, now Pat. No. 7,782,926.

(60) Provisional application No. 61/037,522, filed on Mar. 18, 2008.

(51) Int. Cl.
*H04B 1/707* (2006.01)

(52) U.S. Cl. ......................................... 375/146

(58) Field of Classification Search .................. 375/130, 375/140, 146, 147, 219, 221, 295, 316, 346
See application file for complete search history.

(56) References Cited

U.S. PATENT DOCUMENTS

| | | |
|---|---|---|
| 5,161,153 A | 11/1992 | Westmore |
| 5,235,612 A | 8/1993 | Stilwell et al. |
| 5,297,162 A | 3/1994 | Lee et al. |
| 5,353,300 A | 10/1994 | Lee et al. |
| 5,392,287 A | 2/1995 | Tiedemann et al. |
| 5,404,375 A | 4/1995 | Kroeger et al. |
| 5,442,627 A | 8/1995 | Viterbi et al. |
| 5,596,330 A | 1/1997 | Yokev et al. |
| 5,604,732 A | 2/1997 | Kim et al. |
| 5,649,296 A | 7/1997 | MacLellan et al. |
| 5,691,974 A | 11/1997 | Zehavi et al. |
| 5,745,485 A | 4/1998 | Abramson |
| 5,822,359 A | 10/1998 | Bruckert et al. |
| 5,835,489 A | 11/1998 | Moriya et al. |
| 5,894,473 A | 4/1999 | Dent |
| 5,940,771 A | 8/1999 | Gollnick et al. |
| 5,944,842 A | 8/1999 | Propp et al. |
| 5,960,028 A | 9/1999 | Okamoto et al. |

(Continued)

FOREIGN PATENT DOCUMENTS

CN    2847709    12/2006

(Continued)

OTHER PUBLICATIONS

Richardson, "WCDMA Design Handbook," pp. 268 & 277(Cambridge University Press 2005), retrieved from URLs: http://bit.ly/buMIW0; http://bit.ly/9QcaED.

(Continued)

*Primary Examiner* — Kevin M Burd
(74) *Attorney, Agent, or Firm* — Foley & Lardner LLP

(57) ABSTRACT

A technique and system is disclosed for controlling power in a spread spectrum system. A fast slot of a frame is received where the frame is divided into a number of fast slots. The received power is measured on the fast slot. A second fast slot is transmitted at a second time with a transmit power setting and a variable spreading factor. The transmit power setting and the variable spreading factor is adjusted based on the received power. The variable spreading factor affects the total number of fast slots that are transmitted.

20 Claims, 25 Drawing Sheets

U.S. PATENT DOCUMENTS

| | | | |
|---|---|---|---|
| 5,978,413 | A | 11/1999 | Bender |
| 5,983,113 | A | 11/1999 | Asanuma |
| 5,991,279 | A | 11/1999 | Haugli et al. |
| 6,011,974 | A | 1/2000 | Cedervall et al. |
| 6,016,312 | A | 1/2000 | Storm et al. |
| 6,052,582 | A | 4/2000 | Blasing et al. |
| 6,069,915 | A | 5/2000 | Hulbert |
| 6,091,759 | A | 7/2000 | Rotstein et al. |
| 6,108,364 | A | 8/2000 | Weaver, Jr. et al. |
| 6,115,411 | A | 9/2000 | Van Driest |
| 6,148,020 | A | 11/2000 | Emi |
| 6,160,798 | A | 12/2000 | Reed et al. |
| 6,212,398 | B1 | 4/2001 | Roberts et al. |
| 6,226,282 | B1 | 5/2001 | Chung |
| 6,236,860 | B1 | 5/2001 | Hagting et al. |
| 6,259,927 | B1 | 7/2001 | Butovitsch et al. |
| 6,437,743 | B1 | 8/2002 | Mintz et al. |
| 6,459,402 | B1 | 10/2002 | Tsunehara et al. |
| 6,480,522 | B1 | 11/2002 | Hoole et al. |
| 6,493,376 | B1 | 12/2002 | Harms et al. |
| 6,493,541 | B1 | 12/2002 | Gunnarsson et al. |
| 6,507,574 | B1 | 1/2003 | Kitade et al. |
| 6,522,639 | B1 | 2/2003 | Kitade et al. |
| 6,567,938 | B2 | 5/2003 | Wan |
| 6,587,672 | B1 | 7/2003 | Chuah et al. |
| 6,590,886 | B1 | 7/2003 | Easton et al. |
| 6,597,675 | B1 | 7/2003 | Esmailzadeh et al. |
| 6,615,382 | B1 | 9/2003 | Kang et al. |
| 6,625,197 | B1 | 9/2003 | Lundby et al. |
| 6,628,667 | B1 | 9/2003 | Murai et al. |
| 6,628,675 | B1 | 9/2003 | Neufeld |
| 6,647,077 | B1 | 11/2003 | Shan et al. |
| 6,674,765 | B1 | 1/2004 | Chuah et al. |
| 6,697,415 | B1 | 2/2004 | Mahany |
| 6,701,132 | B1 | 3/2004 | Fukuzawa et al. |
| 6,704,547 | B2 | 3/2004 | Kuwahara et al. |
| 6,711,219 | B2 | 3/2004 | Thomas et al. |
| 6,744,766 | B2 | 6/2004 | Alapuranen |
| 6,748,224 | B1 | 6/2004 | Chen et al. |
| 6,751,451 | B2 | 6/2004 | Rainish et al. |
| 6,760,772 | B2 | 7/2004 | Zou et al. |
| 6,765,953 | B1 | 7/2004 | Harms et al. |
| 6,771,631 | B1 | 8/2004 | Lappetelainen |
| 6,771,984 | B1 | 8/2004 | Hiramatsu et al. |
| 6,795,488 | B1 | 9/2004 | Iwakiri |
| 6,810,078 | B2 | 10/2004 | Bradley |
| 6,836,666 | B2 | 12/2004 | Gopalakrishnan et al. |
| 6,850,499 | B2 | 2/2005 | Wheatley et al. |
| 6,851,086 | B2 | 2/2005 | Szymanski |
| 6,882,682 | B1 | 4/2005 | Tanaka |
| 6,889,055 | B1 | 5/2005 | Neufeld |
| 6,900,753 | B2 | 5/2005 | Tsunehara et al. |
| 6,956,840 | B1 | 10/2005 | Proctor, Jr. |
| 6,970,518 | B2 | 11/2005 | Kuffner et al. |
| 6,999,501 | B1 | 2/2006 | Sawyer |
| 7,020,180 | B2 | 3/2006 | Challa et al. |
| 7,039,410 | B2 | 5/2006 | Jovanovic |
| 7,046,717 | B2 | 5/2006 | Kanterakis et al. |
| 7,062,287 | B2 | 6/2006 | Nakamura et al. |
| 7,085,246 | B1 | 8/2006 | LaRosa et al. |
| 7,113,496 | B2 | 9/2006 | Koo et al. |
| 7,149,238 | B2 | 12/2006 | Agee et al. |
| 7,155,658 | B2 | 12/2006 | Huffman et al. |
| 7,171,230 | B2 | 1/2007 | Anderson |
| 7,177,648 | B2 | 2/2007 | Attar et al. |
| 7,190,681 | B1 | 3/2007 | Wu |
| 7,190,684 | B2 | 3/2007 | Cao et al. |
| 7,197,692 | B2 | 3/2007 | Sutivong et al. |
| 7,206,797 | B2 | 4/2007 | Gressel et al. |
| 7,209,517 | B2 | 4/2007 | Sindhushayana et al. |
| 7,218,641 | B2 | 5/2007 | Kuffner et al. |
| 7,221,699 | B1 | 5/2007 | Lindskog |
| 7,239,867 | B2 | 7/2007 | Kotzin et al. |
| 7,280,581 | B2 | 10/2007 | Khan |
| 7,280,587 | B2 | 10/2007 | Motoyoshi et al. |
| 7,292,874 | B2 | 11/2007 | Cave et al. |
| 7,302,276 | B2 | 11/2007 | Bernhardsson et al. |
| 7,308,285 | B2 | 12/2007 | Nelson, Jr. et al. |
| 7,319,684 | B2 | 1/2008 | Tamaki et al. |
| 7,321,601 | B2 | 1/2008 | Rogerson et al. |
| 7,359,727 | B2 | 4/2008 | Tsien et al. |
| 7,386,026 | B1 | 6/2008 | Gold |
| 7,397,824 | B2 | 7/2008 | Okubo |
| 7,415,262 | B2 | 8/2008 | Liu et al. |
| 7,430,178 | B2 | 9/2008 | Kim |
| 7,433,384 | B2 | 10/2008 | Smee et al. |
| 7,477,694 | B2 | 1/2009 | Sanderford et al. |
| 7,496,804 | B2 | 2/2009 | Juncker |
| 7,515,580 | B2 | 4/2009 | Wheatley et al. |
| 7,526,013 | B1 | 4/2009 | Myers |
| 7,535,822 | B2 | 5/2009 | Geile et al. |
| 7,558,226 | B2 | 7/2009 | Anderson et al. |
| 7,586,891 | B1 | 9/2009 | Masciulli |
| 7,586,975 | B2 | 9/2009 | Ryu et al. |
| 7,587,211 | B2 | 9/2009 | Zeng et al. |
| 7,593,383 | B1 | 9/2009 | Myers |
| 7,593,449 | B2 | 9/2009 | Shattil |
| 7,593,452 | B1 | 9/2009 | Myers |
| 7,594,154 | B2 | 9/2009 | Vedantham et al. |
| 7,607,351 | B2 | 10/2009 | Allison et al. |
| 7,613,462 | B2 | 11/2009 | Willenegger et al. |
| 7,616,604 | B2 | 11/2009 | Abdelhamid et al. |
| 7,626,996 | B2 | 12/2009 | Currivan et al. |
| 7,627,347 | B2 | 12/2009 | Codreanu et al. |
| 7,653,357 | B2 | 1/2010 | Matsuo et al. |
| 7,673,192 | B2 | 3/2010 | Currivan et al. |
| 7,675,892 | B2 | 3/2010 | Min |
| 7,680,092 | B2 | 3/2010 | VanLaningham et al. |
| 7,693,213 | B2 | 4/2010 | Sindhushayana et al. |
| 7,702,290 | B1 | 4/2010 | Myers |
| 7,730,380 | B2 | 6/2010 | Kim |
| 7,733,945 | B2 | 6/2010 | Myers et al. |
| 7,734,264 | B2 | 6/2010 | Rao et al. |
| 7,734,946 | B2 | 6/2010 | Kobayashi |
| 7,742,428 | B1 | 6/2010 | Schlesener et al. |
| 7,751,843 | B2 | 7/2010 | Butala |
| 7,782,985 | B2 | 8/2010 | Wang |
| 7,787,513 | B2 | 8/2010 | Siwiak et al. |
| 7,940,735 | B2 | 5/2011 | Kozisek et al. |
| 2002/0021683 | A1 | 2/2002 | Holtzman et al. |
| 2002/0101835 | A1 | 8/2002 | Gerakoulis |
| 2002/0129315 | A1 | 9/2002 | Onvural et al. |
| 2002/0159409 | A1 | 10/2002 | Wolfe et al. |
| 2002/0170013 | A1 | 11/2002 | Bolourchi et al. |
| 2003/0008664 | A1 | 1/2003 | Stein et al. |
| 2003/0026219 | A1 | 2/2003 | Moon et al. |
| 2003/0031196 | A1 | 2/2003 | Nishimura |
| 2003/0054813 | A1 | 3/2003 | Riley et al. |
| 2003/0076812 | A1 | 4/2003 | Benedittis |
| 2003/0181217 | A1 | 9/2003 | Haas et al. |
| 2003/0210735 | A1 | 11/2003 | Ahn et al. |
| 2004/0085920 | A1 | 5/2004 | Sezgin et al. |
| 2004/0086027 | A1 | 5/2004 | Shattil |
| 2004/0213184 | A1 | 10/2004 | Hu et al. |
| 2004/0229640 | A1 | 11/2004 | Wang et al. |
| 2004/0264554 | A1 | 12/2004 | Harms et al. |
| 2005/0025111 | A1 | 2/2005 | Soma |
| 2005/0058151 | A1 | 3/2005 | Yeh |
| 2005/0058153 | A1 | 3/2005 | Santhoff et al. |
| 2005/0090277 | A1 | 4/2005 | Islam et al. |
| 2005/0108617 | A1 | 5/2005 | Lappin, Jr. |
| 2005/0124374 | A1 | 6/2005 | Riley et al. |
| 2005/0143073 | A1 | 6/2005 | Lee et al. |
| 2005/0157692 | A1 | 7/2005 | Gerakoulis |
| 2005/0169205 | A1 | 8/2005 | Grilli et al. |
| 2005/0207383 | A1 | 9/2005 | Carsello et al. |
| 2005/0208961 | A1 | 9/2005 | Willenegger |
| 2005/0249164 | A1 | 11/2005 | Kwak et al. |
| 2005/0254467 | A1 | 11/2005 | Li et al. |
| 2005/0276249 | A1 | 12/2005 | Damnjanovic et al. |
| 2006/0045195 | A1 | 3/2006 | Ok et al. |
| 2006/0046789 | A1 | 3/2006 | Huh et al. |
| 2006/0072538 | A1 | 4/2006 | Raith |
| 2006/0072614 | A1 | 4/2006 | Ogiso et al. |
| 2006/0128414 | A1 | 6/2006 | Shida et al. |
| 2006/0168496 | A1 | 7/2006 | Steele et al. |
| 2006/0242323 | A1 | 10/2006 | Sanderford et al. |

| | | |
|---|---|---|
| 2006/0276134 A1 | 12/2006 | Marinier et al. |
| 2006/0285604 A1 | 12/2006 | Walton et al. |
| 2007/0030862 A1 | 2/2007 | Michels |
| 2007/0042784 A1 | 2/2007 | Anderson |
| 2007/0060057 A1 | 3/2007 | Matsuo et al. |
| 2007/0066320 A1 | 3/2007 | Padovani et al. |
| 2007/0076664 A1 | 4/2007 | An et al. |
| 2007/0076682 A1 | 4/2007 | Kim et al. |
| 2007/0082620 A1 | 4/2007 | Zhang et al. |
| 2007/0130495 A1 | 6/2007 | Yoon et al. |
| 2007/0133605 A1 | 6/2007 | Herrmann |
| 2007/0147337 A1 | 6/2007 | Bosch et al. |
| 2007/0189047 A1 | 8/2007 | Lee et al. |
| 2007/0195866 A1 | 8/2007 | Seibert et al. |
| 2007/0211786 A1 | 9/2007 | Shattil |
| 2007/0214399 A1 | 9/2007 | Lim et al. |
| 2007/0258508 A1 | 11/2007 | Werb et al. |
| 2007/0274267 A1 | 11/2007 | Tiedemann, Jr. et al. |
| 2007/0276987 A1 | 11/2007 | Luo et al. |
| 2008/0022184 A1 | 1/2008 | Jeong et al. |
| 2008/0032625 A1 | 2/2008 | Cheung et al. |
| 2008/0036589 A1 | 2/2008 | Werb et al. |
| 2008/0037431 A1 | 2/2008 | Werb et al. |
| 2008/0037454 A1 | 2/2008 | Werb et al. |
| 2008/0037569 A1 | 2/2008 | Werb et al. |
| 2008/0040509 A1 | 2/2008 | Werb et al. |
| 2008/0052609 A1 | 2/2008 | Peng et al. |
| 2008/0062951 A1 | 3/2008 | Kanterakis et al. |
| 2008/0075035 A1 | 3/2008 | Eichenberger |
| 2008/0075216 A1 | 3/2008 | Li et al. |
| 2008/0130534 A1 | 6/2008 | Tomioka |
| 2008/0153483 A1 | 6/2008 | Abu-Amara |
| 2008/0161033 A1 | 7/2008 | Borran et al. |
| 2008/0182511 A1 | 7/2008 | Adkins et al. |
| 2008/0188265 A1 | 8/2008 | Carter et al. |
| 2008/0192661 A1 | 8/2008 | Hamamoto et al. |
| 2008/0192738 A1 | 8/2008 | Florencio et al. |
| 2008/0207251 A1 | 8/2008 | Anderson |
| 2008/0232330 A1 | 9/2008 | Lee et al. |
| 2008/0267126 A1 | 10/2008 | Vujcic et al. |
| 2008/0282137 A1 | 11/2008 | You et al. |
| 2009/0031035 A1 | 1/2009 | Dharmaraju et al. |
| 2009/0077444 A1 | 3/2009 | Qi et al. |
| 2009/0089638 A1 | 4/2009 | Heise et al. |
| 2009/0092055 A1 | 4/2009 | Balasubramanian et al. |
| 2009/0113267 A1 | 4/2009 | Harrison et al. |
| 2009/0135754 A1 | 5/2009 | Yavuz et al. |
| 2009/0137241 A1 | 5/2009 | Yavuz et al. |
| 2009/0147873 A1 | 6/2009 | Li et al. |
| 2009/0149140 A1 | 6/2009 | Borran et al. |
| 2009/0163238 A1 | 6/2009 | Rao et al. |
| 2009/0238201 A1 | 9/2009 | Myers |
| 2009/0238210 A1 | 9/2009 | Myers et al. |
| 2009/0238248 A1 | 9/2009 | Myers et al. |
| 2009/0249155 A1 | 10/2009 | Mayrench et al. |
| 2009/0274164 A1 | 11/2009 | Myers |
| 2009/0280812 A1 | 11/2009 | Cheng et al. |
| 2009/0327835 A1 | 12/2009 | Oteri et al. |
| 2010/0086087 A1 | 4/2010 | Pekonen et al. |
| 2010/0111070 A1 | 5/2010 | Hsu |
| 2010/0162035 A1 | 6/2010 | Rancurel et al. |
| 2010/0167777 A1 | 7/2010 | Raghothaman et al. |
| 2010/0167778 A1 | 7/2010 | Raghothaman et al. |
| 2010/0215080 A1 | 8/2010 | Hamaguchi et al. |
| 2010/0329311 A1 | 12/2010 | Hannan et al. |
| 2011/0134965 A1 | 6/2011 | Myers et al. |

FOREIGN PATENT DOCUMENTS

| | | |
|---|---|---|
| CN | 101260976 | 9/2008 |
| EP | 2 197 124 | 6/2010 |
| GB | 2 379 358 | 3/2003 |
| GB | 2 462 063 | 1/2010 |
| JP | 10-303801 | 11/1998 |
| JP | 2003-116162 | 4/2003 |
| JP | 2004-023350 | 1/2004 |
| JP | 2008-054014 | 3/2008 |
| JP | 2009-276890 | 11/2009 |
| KR | 10200331124 | 4/2003 |
| KR | 100691367 | 2/2007 |
| KR | 20080088774 | 10/2008 |
| WO | WO-97/02663 | 1/1997 |
| WO | WO-00/38361 | 6/2000 |
| WO | WO-01/08322 | 2/2001 |
| WO | WO-01/67786 | 9/2001 |
| WO | WO-01/98618 | 12/2001 |
| WO | WO-02/09320 | 1/2002 |
| WO | WO-02/11304 | 2/2002 |
| WO | WO-2005/102214 | 3/2005 |
| WO | WO-2006/031073 | 3/2006 |
| WO | WO-2010/006909 | 1/2010 |

OTHER PUBLICATIONS

Bayer et al., "Improving the Performance of the Distributed Scheduler in IEEE 802. 16 Mesh Networks." In IEEE vehicular technology conference (VTC 2007-Spring) [online], 2007, p. 1-5, [retrieved on Dec. 3, 2008]. Retrieved from the Internet: <URL: http://www.staff.city.ac.uk/~veselin/publications/Bayer_VTC07. pdf>. Citation available at <URL: http://portal.acm.org/citation. cfm?id=1413939.1413942&coll=GUIDE&dl=GUIDE>(see item 25).

Buzzi et al., "Joint Receiver and Transmitter Optimization for Energy-Efficient CDMA Communications," To Appear in IEEE JSAC—Special Issue on Multiuser Detection for Advanced Communication Systems and Networks, Presented at 2007 European Wireless Conference and at 2007 IEEE International Symposium on Information Theory, [Retrieved on Feb. 25, 2009], Retrieved from the Internet <URL: http://arxiv.org/PS_cache/arxiv/pdf/0712/0712. 1339v1.pdf>, 2007.

Cao et al., "Modelling and Performance Analysis of the Distributed Scheduler in IEEE 802. 16 Mesh Mode." In: MobiHoc'05 [online], May 25-27, 2005, p. 78-89, [retrieved on Dec. 3, 2008]. Retrieved from the Internet: <URL: http://lion.cs.uiuc.edu/group_seminar_slides/p78-cao.pdf.>.

Hamalainen, Jyri, "Cellular Network Planning and OptimiZation Part VI: WCDMA Basics" [Retrieved on Jan. 27, 2009], Retrieved from the Internet <URL: http://www.comlab.hut.fi/studies/3275/Cellular_network_planning_and_optimization_part6.pdf.

International Search Report and Written Opinion for PCT/US/2009/036766 mailed Oct. 28, 2009.

International Search Report and Written Opinion for PCT/US2009/036743 dated Oct. 28, 2009.

Lee et al., "CDMA Systems Engineering Handbook," Artech House, 1998, pp. 335-423.

Schwartz, "Mobile Wireless Communications," pp. 327 (Cambridge University Press 2005), retrieved from URL: http://bit.ly/9BYDhy.

Non-final Office Action received on U.S. Appl. No. 12/345,374 dated Feb. 17, 2010.

Notice of Allowance received on U.S. Appl. No. 12/472,642 dated Jan. 26, 2010.

Notice of Allowance received on U.S. Appl. No. 12/483,722 dated Feb. 18, 2010.

Sunay et al., "Mobile Location Tracking in DS CDMA Networks Using Forward Link Time Difference of Arrival and Its Application to Zone-Based Billing." In: Global Telecommunications Conference, 1999. GLOBECOM '99 [online], vol. 1a, p. 143-147, [retrieved on Nov. 20, 2008]. Retrieved from the Internet: <URL: http://portal.ku.edu.tr/~osunay/papers/GCOM99-geolocation.pdf>. Citation on the Internet: <URL: http://ieeexplore.ieee.org/xpl/freeabs_all.jsp?arnumber=831624>.

Notice of Allowance received on U.S. Appl. No. 12/189,619 dated Jun. 26, 2009.

Notice of Allowance received on U.S. Appl. No. 12/189,533 dated Jun. 3, 2009.

Notice of Allowance received for U.S. Appl. No. 12/189,609 on dated Mar. 23, 2010.

Non-final Office Action received on U.S. Appl. No. 12/189,609 dated Jun. 18, 2009.

Final Office Action received on U.S. Appl. No. 12/189,609 dated Jul. 22, 2009.

Final Office Action (2) received on U.S. Appl. No. 12/189,609 dated Sep. 4, 2009.

Non-final Office Action received on U.S. Appl. No. 12/189,619 dated Apr. 2, 2009.
Non-final Office Action received on U.S. Appl. No. 12/345,374 dated Sep. 4, 2009.
US Office Action received on U.S. Appl. No. 12/472,642 dated Dec. 3, 2009.
Non-final Office Action received on U.S. Appl. No. 12/483,722 dated Jan. 11, 2010.
Wang et al.; "Error Statistics of Closed-Loop Power Control in Multirate DS-CDMA Cellular Systems," IEEE Xplore, [Retreived on Feb. 23, 2009], Retrieved from the Internet <URL: http://ieeexplore.ieee.org/Xplore/login.jsp?url=/iel5/7793/21424/00993355.pdf?arnumber=993355>, 2002.
Xu, Liang, "Dynamic Fair Scheduling with QoS Constraints in Multimedia Wideband CDMA Cellular Networks," IEEE Transactions on Wireless Communications, vol. 3, No. 1; [Retrieved on Feb. 25, 2009], Retrieved from the Internet <URL: http://ieeexplore.ieee.org/Xplore/login.jsp?url=/iel5/7693/28152/01259400.pdf?arnumber=1259400, Jan. 2004.
Yang et al, "Software-Defined-Radio-Assisted Adaptive Broadband Frequency Hopping Multicarrier DS-CDM," IEEE Communications Magazine, [Retrieved on Feb. 25, 2009], Retrieved from the Internet <URL: http://ieeexplore.ieee.org/Xplore/login.jsp?url=ielx5/35/21325/00989783.pdf?arnumber=989783>, Mar. 2002.
Zhao et al., "Joint Rate and Power Adaption for Radio Resource Management in Uplink Wideband Code Division Multiple Access Systems," Institution of Engineering and Techonology (IET) Communications, vol. 2, No. 4, pp. 562-572, [Retrieved on Feb. 25, 2009], Retrieved from the Internet <URL: http://ieeexplore.ieee.org/Xplore/login.jsp?url=?iel5/4105970/4493358.pdf?arnumber=4493358>, Jan. 2007.
Zhao, Y., "Mobile Phone Location Determination and Its Impact on Intelligent Transportation Systems." In: IEEE Transactions on Intelligent Transportation Systems [online], vol. 1, No. 1, Mar. 2000, p. 55-64, [retrieved on Nov. 20, 2008]. Retrieved from the Internet: <URL: http://www.ss.fpp.edu/~fdimc/laboratorijsk_vaje/Inteligentni_transportni_sistemi/Literature_za_sirjenje_obzorja/ITS_mobile_phone_location_determination.pdf>.
International Preliminary Report on Patentability received for PCT/US2009/0367423 mailed Sep. 30, 2010.
International Preliminary Report on Patentability received for PCT/US2009/036766 mailed Sep. 30, 2010.
International Search Report and Written Opinion received for PCT/US2010/035419 mailed Dec. 23, 2010.
Manchiraju, "Evaluation of pseudorandom sequences used in third generation spread spectrum systems," 2003, Retrieved from the internet at: http://etd.ohiolink.edu/etd/send-pdf.cgi/Manchiraju%20Dinakar.pdf?acc_num=ohiou1081801327, 100 pages.
Meerkerk, "Experimental propagation analysis in a CDMA 1X macro cell," 2005. Retreieved from the internet at: http://lib-ir.lib.sfu.ca/retrieve/2426/etd2025.pdf, 71 pages.
Wha Sook Jeon, Dong Geun Jeong, Comparison of Time Slot Allocation Strategies for CDMA/TDD Systems, IEEE Journal on Selected Areas in Communications, vol. 18, No. 7, Jul. 2000, p. 1271-1278.
Final Office Action for U.S. Appl. No. 12/345,374 dated Nov. 10, 2009.
Haardt et al., "The TD-CDMA Based UTRA TDD Mode," IEEE Journal on Selected Areas in Communications, vol. 18, No. 8, Aug. 2000, p. 1375-1385.
Jeong et al.,"CDMA/TDD System for Wireless Multimedia Services with Traffic Unbalance Between Uplink and Downlink," IEEE Journal on Selected Areas in Communications, vol. 17, No. 5, May 1999, pp. 939-946.
Monks et al., "Transmission power control for multiple access wireless packet networks," Proceedings 25th Annual IEEE Conference on Local Computer Networks, Nov. 2000, 10 pages.
Non-final Office Action received for U.S. Appl. No. 12/276,971 dated Apr. 13, 2010.
Notice of Allowance received for U.S. Appl. No. 12/276,971 dated Jul. 30, 2010.

Notice of Allowance received for U.S. Appl. No. 12/345,374 on dated Mar. 31, 2010.
Aronsohn, "Digital RF-Communication between Mobile Platforms in the Presence of Interference" Chalmers University of Technology, Jun. 2004.Retrieved on Aug. 17, 2010 from the internet at: htttp://citeseerx.ist.psu.edu/viewdoc/download?doi=10.1.1.63.9851&rep=rep1&type=pdf; (67 pgs.)
Fumo et al., "Satellites & solid state electronics test concrete pressure water pipelines,"(2000), Retrieved from the internet at: http://www.pipepressure.com/pdfs/SPIE%20NDE%20Conf%202000%20-%20Acoustic%20Tesing.pdf, 10 pages.
Hasu. "Radio Resource Management in Wireless Communication: Beamforming, Transmission Power Control, and Rate Allocation." Helsinki University of Technology, Jun. 2007. Retrieved on Aug. 5, 2010 from the Internet at http://citeseerx.ist.psu.edu/viewdoc/download?doi=10.1.1.96.3380&rep=rep1&type=pdf; (110 pgs.)
Hund et al. "Overview of MAC layer Enhancements for IEEE 802.15.4a." Retrieved on Jul. 26, 2010 from the Internet at http://www.johanneshund.de/files/Hund2009.pdf. Publication year of 2009 inferred from the URL; (7 pgs.)
Luby et al. "Efficient Erasure Correcting Codes." In: IEEE Transactions on Information Theory, vol. 47, No. 2, Feb. 2001, pp. 569-584. Retrieved on Jul. 26, 2010 from the Internet at http://www.ldpccodes.com/papers/eraseIT.pdf.
Non-Final Office Action U.S. Appl. No. 12/751,724; Dated Apr. 8, 2011, (7 pgs.)
Qiao et al. "IEEE 802.11h: Technology and Application." Published in IT Professional, vol. 8, No. 2, Mar./Apr. 2006. Retrieved on Aug. 5, 2010 from the Internet at http://www.mwnl.snu.ac.kr/~schoi/publication/Journals/06-ITPro.pdf. Citation available as reference [1] of http://kom.aau.dk/~ff/documents/pimrc2008.pdf; (5 pgs.)
Subramanian et al. "Disruption-tolerant link-level mechanisms for extreme wireless network environments." In: Proceedings of the 2nd International Conference on Communication System Software and Middleware (COMSWARE 2007), Jan. 7-12, 2007. Retrieved on Jul. 26, 2010 from the Internet at http://citeseerx.ist.psu.edu/viewdoc/download?doi=10.1.1.143.4028&rep=rep1&type=pdf; (8 pgs.)
Wadekar et al. "Adaptive transmission power control and coding for wireless sensor networks." Published in IET Conference on Wireless, Mobile and Sensor Networks 2007 (CCWMSNO7), vol. 2007, issue CP533, Dec. 12-14, 2007. pp. 1063-1066. Retrieved on Aug. 5, 2010 from the Internet at http://scitation.aip.org/getabs/servlet/GetabsServlet?prog=normal&id=IEECPS0020070CP533001063000001&idtype=cvips&gifs=yes&ref=no.
Yi et al. "CORA: Collaborative Opportunistic Recovery Algorithm for loss controlled, delay bounded ad hoc multicast." In: Computer Communications, vol. 31, issue 15, pp. 1-27, Sep. 25, 2008, Retrieved on Jul. 26, 2010 from the Internet at http://www.sciencedirect.com/science?_ob=ArticleURL&_udi=B6TYP-4SXYG00-3&_user=10&_coverDate=09%2F25%2F2008&_rdoc=1&_fmt=high&_orig=search&_sort=d&_docanchor=&view=c&_searchStrId=1412544378&_rerunOrigin=scholar.google&_acct=C000050221&_version=1&_urlVersion=0&_userid=.
Clancy, T. Charles; "Dynamic Spread Spectrum Access in Cognitive Radio Networks"; Retrieved from the internet on Oct. 15, 2010 from: http://citeseerx.ist.psu.edu/viewdoc/download?doi=10.1.1.135.724&rep=rep1&type=pdf (116 pgs.).
DaFalla, et al.; "Performance Study of Power Control Radio Resource Management Over WLANs"; Journal of Computer Science (2008); vol. 4, No. 3, pp. 239-244.
Hermanns, "Secure and Robust Tactical Communications Based on Code-Hopping CDMA (CH-CDMA)" Apr. 2008, Retrieved from the internet at: http://ftp.rta.nato.int/public/PubFullText/RTO/MP/RTO-MP-IST-083/MP-IST-083-16.pdf, (14 pgs.).
Weisstein, Eric W. "Cyclic Redundancy Check." From MathWorld—A Wolfram Web Resource. http://mathworld.wolfram.com/CyclicRedundancyCheck.html, accessed May 5, 2011, (1 pg.).
Woo, G., et al., "Beyond the Bits: Cooperative Packet Recovery Using Physical Layer Information" Proceedings of the 13th annual ACM international conference on Mobile computing and networking, Sep. 14, 2007, Retrieved from the internet at: http://portal.acm.org/citation.cfm?id=1287853.1287871, (12 pgs.).

Yuan, S., et al., "Digital Watermarking-Based Authentication Techniques for Real-Time Multimedia Communication" Dec. 9, 2005, Retrieved from the internet at: http://deposit.ddb.de/cgi-bin/dokserv?idn=980187419&dok_var=d1&dok_ext=pdf&filename=980187419.pdf, (109 pgs.).

Non-Final Office Action, dated Jun. 3, 2011; U.S. Appl. No. 13/032,393, Filed: Feb. 22, 2011, (13 pgs.).

Final Office Action; in re U.S. Appl. No. 12/751,724; Dated: Jul. 13, 2011; Applicant: Theodore J. Myers, (12 pgs.).

Notice of Allowance; in re: U.S. Appl. No. 13/027,654; mailed: Jun. 13, 2011; Applicant: Theodore J. Myers; (10 pgs.).

Supplementary European Search Report; in re: European Patent Application No. 09721805.1; Applicant: On-Ramp Wireless, Inc.; Mailed: Jun. 20, 2011 (6 pgs.).

Supplementary European Search Report; in re: European Patent Application No. 09723436.3; Applicant: On-Ramp Wireless, Inc.; Mailed: Jun. 29, 2011 (8 pgs.).

Notice of Allowance; in re: U.S. Appl. No. 13/032,393; Dated Jul. 27, 2011; Applicant: Theodore J. Myers; (10 pgs.).

Non-Final Office Action; in re: U.S. Appl. No. 13/035,459; Dated: Jul. 26, 2011; Applicant: Theodore J. Myers, (11 pgs.).

CONTROLLING POWER IN A SPREAD SPECTRUM SYSTEM

CROSS-REFERENCE TO RELATED PATENT APPLICATIONS

The present application is a continuation of U.S. application Ser. No. 12/751,724 filed Mar. 31, 2010. U.S. patent application Ser. No. 12/751,724 is a continuation in part of U.S. application Ser. No. 12/189,609, filed Aug. 11, 2008, which claims priority to U.S. Provisional Application No. 61/037,522, filed Mar. 18, 2008 the entire disclosures of which are incorporated herein by reference.

FIELD

Embodiments of the present application relate to the field of communications. More specifically, representative embodiments relate to methods and systems for controlling power in a random phase multiple access (RPMA) communication interface.

SUMMARY

Representative embodiments described herein include a fast-slotted power control system for a spread spectrum communication system, such as a random phase multiple access spread spectrum communication system. Multiple access spread spectrum communication systems that allow multiple simultaneous transmitters require transmissions from nodes to arrive at an access point's receiver at about equivalent power levels to avoid desensing the access point's receiver. This requirement can be difficult in a system using half-duplex transmissions, especially when changing signal propagation characteristics are present. A spread spectrum system that transmits data in frames at half duplex divides transmission opportunities into uplink (from nodes to an access point) and downlink (from the access point to the nodes) slots. A fast slot system described here involves subdividing uplink and downlink transmissions into "fast slots" at a rate that may be independent of a frame rate. The frame rate correlates to a process gain of the spread spectrum system. When large spreading factors are used in order to increase the process gain of the spread spectrum system, a larger frame transmission time and a slower frame rate are natural outcomes. At the slower frame rate, there are fewer opportunities for controlled power adjustments by nodes. This is because generally the larger frame transmission time, and consequently larger transmission opportunities, means that the nodes' receivers detect power fluctuations less frequently. Fast-slotted techniques described herein provide significantly smaller transmission opportunities, while maintaining the large spreading factor and process gain of the system. With significantly smaller transmission opportunities, open-loop power control can be used by nodes to quickly adjust transmit power based on received power. At least one representative technique described here achieves large-frame durations which support high receive sensitivity through a large spreading factor and process gain, while also providing a more frequent power control update rate.

One representative implementation of the fast slot system involves all participants in a communication system. An access point's transmitter provides timing for the communication system and sends transmissions in small fast slots. A node's receiver first acquires a signal of the access point's transmitter, including timing that is subsequently used by the node. The node's receiver receives the small fast slots and reconstructs those fast slots of data into frames. The node also receives power information from the transmission. The node's transmitter sends data to the access point in fast slots that correspond to uplink transmission opportunities. The node's transmitter also adjusts its transmit power based on the received power. The access point's receiver receives the fast slots and reconstructs the data transmitted by the nodes.

An exemplary embodiment implements a method for power control in a half-duplex, multiple access spread spectrum communication system. A system receives a first fast slot of a first frame at a first time at a receiver, wherein the frame is divided into a plurality of fast slots. The system measures a first received power based on receiving the first fast slot. The system transmits a second fast slot of a second frame at a second time at a power setting at a transmitter. The second frame is divided into a second plurality of fast slots. A number of fast slots in the second plurality of fast slots is determined in part from a variable spreading factor. The power setting is determined in part from the first received power. The variable spreading factor is determined in part from the first received power.

In one exemplary embodiment, the second frame is spread using a PN code that also spreads a transmission by a second transmitter, and wherein the receiver and the transmitter are on a node.

In another exemplary embodiment, the second time is less than or equal to 2.048 milliseconds after the second time.

In another exemplary embodiment, each fast slot of the plurality of fast slots is smaller than a symbol.

In another exemplary embodiment, each fast slot of the plurality of fast slots contains a plurality of symbols.

In another exemplary embodiment, the second time comprises a random time offset.

In another exemplary embodiment, the first time comprises a random time offset.

In another exemplary embodiment, the first frame and the second frame are modulated using 2-ary modulation.

An exemplary embodiment implements a method for power control in a half-duplex, multiple access spread spectrum communication system. A system receives a first fast slot of a first frame at a first time at a receiver, wherein the frame is divided into a plurality of fast slots. The system measures a first received power based on receiving the first fast slot. The system transmits a second fast slot of a second frame at a second time at a power setting at a transmitter. The second frame is divided into a second plurality of fast slots. A number of fast slots in the second plurality of fast slots is determined in part from a variable spreading factor. The power setting is determined in part from the first received power. The variable spreading factor is determined in part from the first received power. The system may abort a prior transmission after measuring the received power. The system may then make the second frame a repeat of the prior transmission.

In another exemplary embodiment, a number of fast slots in the second plurality of fast slots is determined in part from a constant frame size.

In another exemplary embodiment, at least a portion of the second fast slot overlaps at least a portion of a third fast slot in a slot which is transmitted by a second transmitter such that the second fast slot and the third fast slot can be received.

An exemplary embodiment may be implemented on a node capable of controlling transmit power in a half-duplex, multiple access spread spectrum communication system. The node is composed of a receiver configured to receive a first fast slot of a first frame at a first time, wherein the first frame is divided into a first plurality of fast slots and to measure a first received power based on receiving the first fast slot. The node also is composed of a transmitter configured to transmit a second fast slot of a second frame at a second time at a power setting wherein the second frame is divided into a second plurality of fast slots, wherein a number of fast slots in the second plurality of fast slots is determined in part from a variable spreading factor. The node also is composed of a processor configured to adjust the power setting as determined in part from the first received power and to adjust the variable spreading factor as determined in part from the first received power.

An exemplary embodiment may implement the node where the second frame is spread using a PN code that also spreads a transmission by a second transmitter, and where the receiver and the transmitter are on the node.

An exemplary embodiment may implement the node where the second time is less than or equal to 2.048 after the second time.

An exemplary embodiment may implement the node where each fast slot of the plurality of fast slots is smaller than a symbol.

An exemplary embodiment may implement the node where the second time comprises a random time offset.

An exemplary embodiment may implement the node where the first frame and the second frame are modulated using 2-ary modulation.

An exemplary embodiment may implement the node where the processor is further configured to abort a prior transmission after the first received power is measured.

An exemplary embodiment may be implemented in software and stored on a computer-readable medium having computer-readable instructions stored thereon. When executed by a processor a node can be caused to receive a first fast slot of a frame at a first time at a receiver, wherein the frame is divided into a first plurality of fast slots. The instructions can cause the node to measure a first received power based on receiving the first fast slot. The instructions can cause the node to adjust a power setting as determined in part from the first received power. The instructions can cause the node to adjust a variable spreading factor as determined in part from the first received power. The instructions can cause the node to transmit a second fast slot of a second frame at a second time at the power setting. The second frame is divided into a second plurality of fast slots. A number of fast slots in the second plurality of fast slots is determined in part from the variable spreading factor.

DETAILED DESCRIPTION

Figure 1:
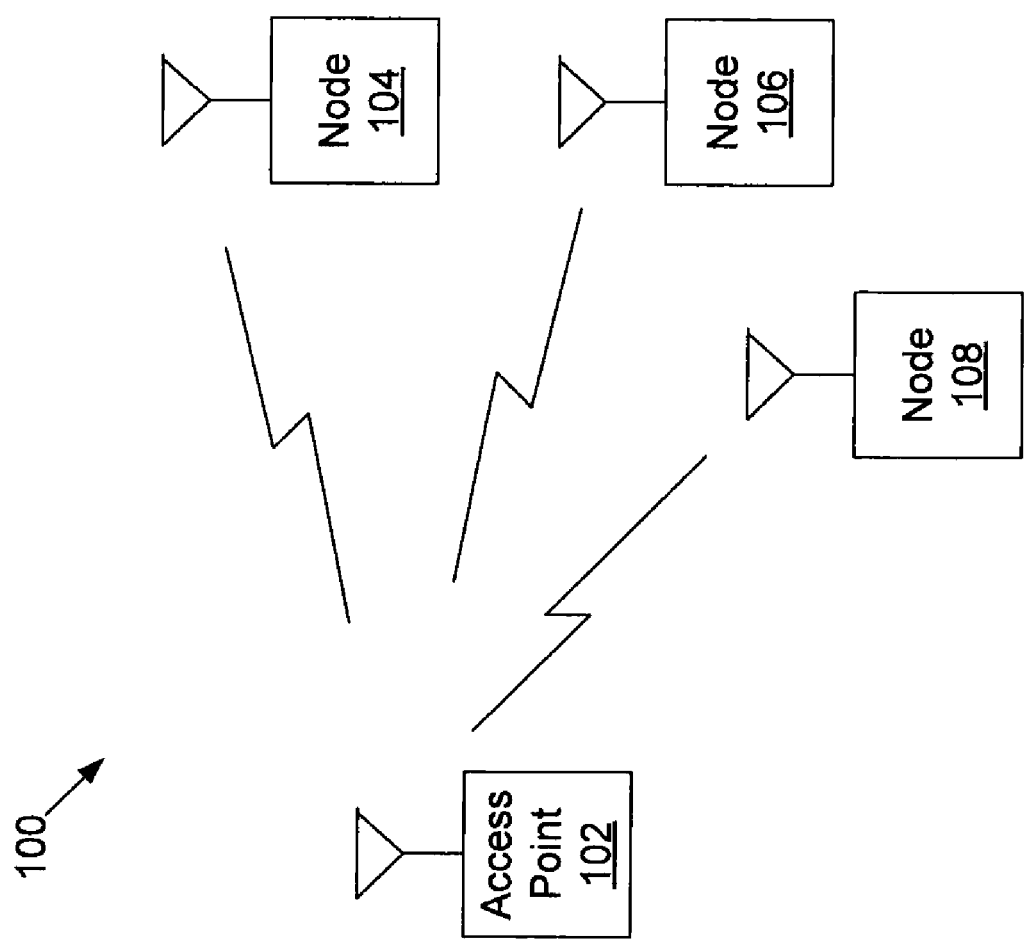
FIG. 1 is an illustration of a simplified network map having an access point and nodes.

FIG. 1 is an illustration of a simplified network map 100 having an access point 102 and nodes 104, 106, and 108. Access point 102 communicates with nodes 104, 106, and 108 via a spread spectrum communication system. Access point 102 transmits such that any node within range may determine timing and receive a signal from access point 102. Nodes 104, 106, and 108 may transmit to access point 102 such that transmitted signals overlap each other and that node transmitters operate simultaneously. Signals from nodes 104, 106, and 108 can be received and demodulated by access point 102 because the signals are quasi-orthogonal to each other. As used herein, a node or tag can refer to any communications device configured to receive signals from and/or send signals to an access point. An access point can refer to any communications device configured to simultaneously communicate with a plurality of nodes or tags. In a representative embodiment, nodes can be mobile, low power devices which run off a battery or other stored power, and an access point can be located in a central location and receive power from a power source such as a wall outlet or generator. Alternatively, nodes may plug into an outlet and/or the access point may run off of a battery or other stored power source.

In a communication system, during a transmission, a signal occupies a frequency domain. In direct sequence spread spectrum systems, a signal may be spread in the frequency domain by a pseudo-noise (PN) signal. The spreading of the signal introduces process gain which enhances a signal to noise ratio of the signal in relation to a spreading width, or number of bits used to spread the signal. One effect of this improved signal-to-noise ratio is that a spread signal is resilient to introduced interference, such as by other signals, that may be broadcast in a common bandwidth as the spread signal. This effect depends on an ability of the receiver to correlate the spread signal with a PN code used to spread it. Only the signal that was spread with a particular PN code, and synchronized to a despreader (at a correct timing offset), receives process gain. All other signals receive almost no gain and serve as minimal interference. An ability to have multiple signals in the same bandwidth depends in part on cross-correlation properties of the particular PN codes used in transmission.

In a technique where fully orthogonal codes are used, there is no correlation between the fully orthogonal codes, but this requires a receiver to know exactly which code a transmitter is using and requires the receiver to be exactly time aligned with the transmitter. With PN codes, which are not fully orthogonal but may be considered quasi-orthogonal, there is some correlation. So long as correlation between transmitted signals remains low, the signal-to-noise ratio of a received signal can remain high. In systems where different PN codes are used, a receiver must still know exactly which code a transmitter is using and the receiver must still be exactly time aligned with the transmitter. In a random phase multiple access (RPMA) system a random time element can be introduced to offset a PN code in time or to offset a time of the transmission, even though an identical PN code may be used by separate transmitters. A random time offset makes multiple spread signals that are received simultaneously quasi-orthogonal to each other. In reception, only a signal that is despread using a time offset that a transmitter used to spread the signal receives process gain.

Figure 2:
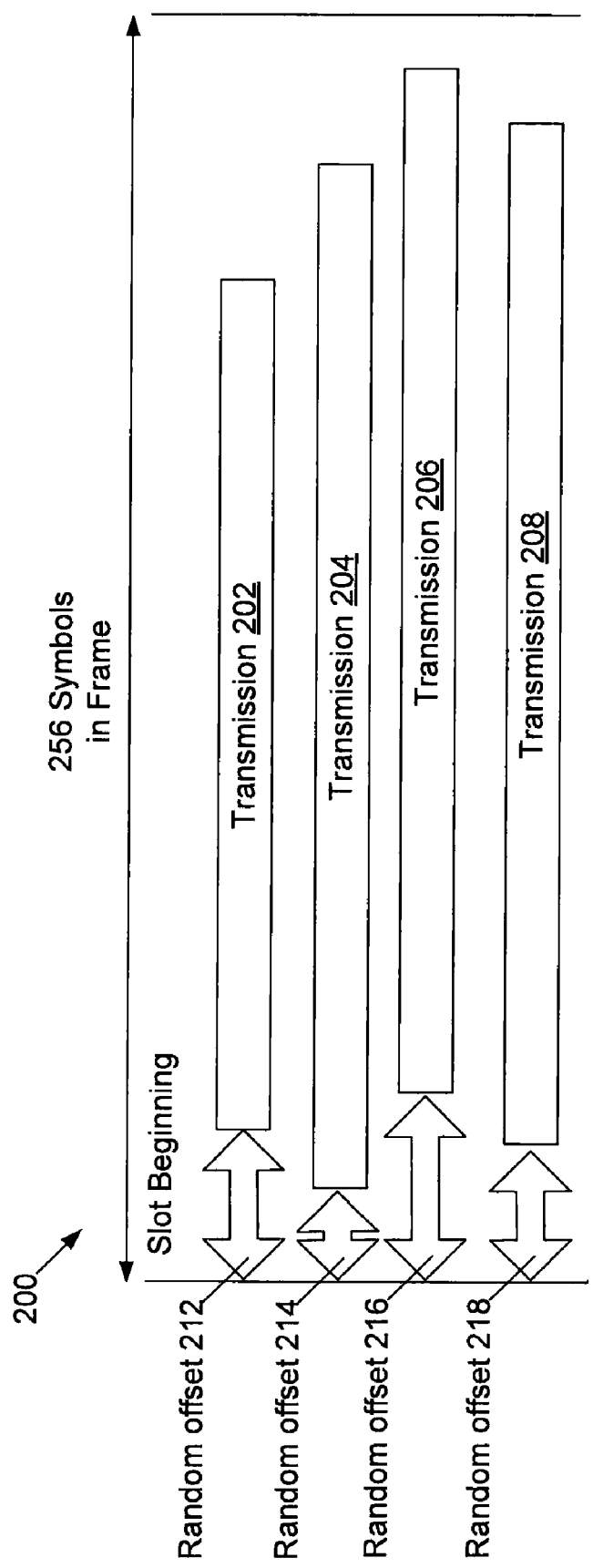
FIG. 2 is a diagram illustrating one uplink slot having transmissions.

FIG. 2 is a diagram illustrating one uplink slot 200 having transmissions 202, 204, 206, and 208. Transmissions 202, 204, 206, and 208, which may all originate from separate nodes, all begin at random offsets 212, 214, 216, and 218 from beginning of the uplink slot. Transmissions 202, 204, 206, and 208 overlap in time such that, at certain points in time, transmitters are operating simultaneously. However, all signals may be resolved by a single receiver, because the transmissions are quasi-orthogonal to each other. The beginning and end points of the transmissions are staggered, due to a random time offset from the beginning of the slot. A retransmission protocol may be used to correct errors, since nodes may occasionally pick a random time offset already chosen by another node. A frames may be identical in a total number of symbols. In this diagram, a frame size of 256 symbols is shown, but other sizes may be used. The frame size may be held constant for all transmissions, though the frame transmission time may vary. A total number of fast slots that are used to transmit the frames depends on a variable spreading factor chosen to spread the frames.

In an RPMA system, a received power observed by an access point may be important to control in order to avoid desensing the access point to other received signals. One method of controlling power is to use an open loop power control. In open loop power control, a node adjusts its power output based on received characteristics of a transmission from the access point. The node may continuously measure power received from the access point in recent fast slots. When the measured power goes down, the node compensates for a likely power loss at the access point's receiver by increasing the node's output power. Similarly, when the power received goes up, the node decreases its own power output on an assumption that symmetrical characteristics of a transmission medium leads to a power increase at the access point. This compensation can help to avoid the node desensing other nodes at the access point and can help transmissions from the node to continue to be received even in changing signal propagation circumstances. Where a time between transmission by the access point and transmission by the node is long, this open loop control may be less useful. The power received as observed by the access point may be best controlled in an open loop method by making a time between transmission by the access point and transmission by the node short. The fast slot technique described accomplishes this for a general purpose spread spectrum system.

Techniques presented may also be used to improve reception in the face of phase errors, including phase errors created in high doppler environments. When a doppler induced phase error occurs, demodulation of a spread spectrum signal can still be achieved by analyzing a received signal. Compensation for doppler phase errors can be performed by receiving a signal that has been spread using a pseudo-noise (PN) code, dividing the signal into a plurality of smaller coherent units, and then compensating for phase errors by analyzing the plurality of smaller coherent units. An analysis of the smaller coherent units includes summing across each of the plurality of smaller coherent units to produce a plurality of coherent sums. These coherent sums may then be summed non-coherently such that a system can then detect a magnitude of the signal. The magnitude of the signal can be used for further tuning of a receiver. An illustrative embodiment may then base a coherent integration length, a chip timing, a sub-chip timing, an automatic frequency control selection, or other receive or transmit parameters on the magnitude of the signal. Transmission parameters may be based on received characteristics. A doppler phase error may be detected on a received signal. A modulation technique may then be selected to encode a symbol stream. The encoded stream may then be transmitted.

Figure 3:
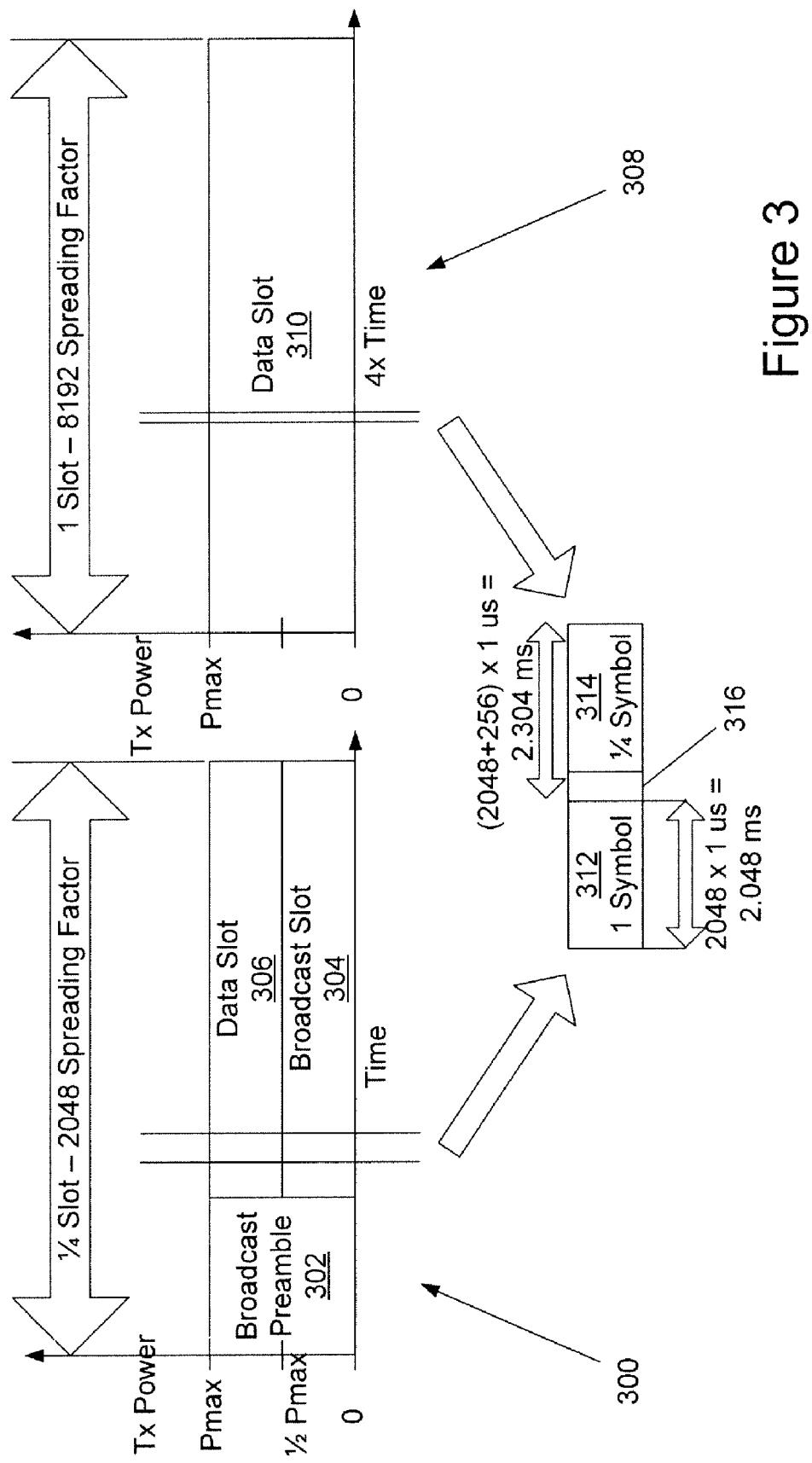
FIG. 3 is a diagram illustrating the structure of a downlink frame and an uplink frame in accordance with a representative embodiment.

FIG. 3 is a diagram illustrating the structure of a downlink frame 300 including broadcast preamble 302, broadcast slot 304, and data slot 306 and an uplink frame 308 including data slot 310 in accordance with a representative embodiment. The Y-axis shows a transmit power of a signal. The X-axis shows a time of transmission. Downlink frame 300 and uplink frame 308 are divided into many downlink and uplink fast slots with downlink fast slot 312 and uplink fast slot 314 shown. Combined downlink fast slot 312 and uplink fast slot 314 produce a half-duplex communication system as described herein. In one exemplary case, the number of individual fast slots may consist of 16 downlink fast slots for the broadcast preamble 302 and 256 downlink fast slots for the broadcast slot 304 and the data slot 306. The number of individual fast slots that downlink frame 300 and uplink frame 308 are divided into depends on a particular implementation including factors such as a spreading factor and a frame size. Frame size may be held constant for all frames in a system. When a downlink spreading factor of 2048 and an uplink spreading factor of 8192 are chosen, in one slot, four downlink slots may be transmitted for every uplink slot. In that case, every downlink fast slot contains one symbol while every uplink fast slot contains one forth of a symbol, or 2048 chips. In the exemplary case, downlink fast slot 312 takes 2.048 ms to transmit. Uplink fast slot 314 is paired with an RPMA delay block 316. The RPMA delay block 316 allows transmission of uplink fast slot 314 to begin at any time within the RPMA delay block 316. In the exemplary case, uplink fast slot 314 and RPMA delay block 316 have a combined transmission time of 2.304 ms. In the exemplary case, all uplink fast slots, downlink fast slots, and RPMA delay blocks are identically sized, even though corresponding uplink and downlink frames may be spread by different spreading factors. The different spreading factors of frames result in a variable duration required to transmit uplink and downlink frames. For example, in the previously described case of a downlink spreading factor of 2048 and an uplink spreading factor of 8192, it takes four times as long to transmit an uplink frame as it does to transmit a downlink frame. This is explored further in discussion relating to FIG. 4.

In a representative embodiment, broadcast preamble 302 can be boosted relative to other transmissions made using broadcast slot 304 or data slot 306. As an example, broadcast preamble 302 can be transmitted at a maximum power ($P_{max}$), and other transmissions can be made at one half of the maximum power (½ $P_{max}$). In one embodiment, broadcast preamble 302 can be boosted by 3 decibels (dB) relative to other transmissions via broadcast slot 304 and/or data slot 306. Alternatively, other transmission powers are possible. A boosted preamble allows receivers at nodes to robustly estimate chip timing and AFC/time tracking with reference to an access point. A payload of broadcast preamble 302 can be programmable. In one embodiment, a broadcast slot frame can be identical in creation to a data slot frame with an exception that a broadcast slot gold code generator may reset every symbol whereas a data slot gold code generator may run until the end of the data slot frame before resetting. Resetting the broadcast slot gold code generator at every symbol makes the broadcast slot frame easier to acquire by a receiver. In one embodiment, no channel coding, interleaving, or cyclic redundancy check (CRC) may be applied to the payload of broadcast preamble 302.

Figure 4:
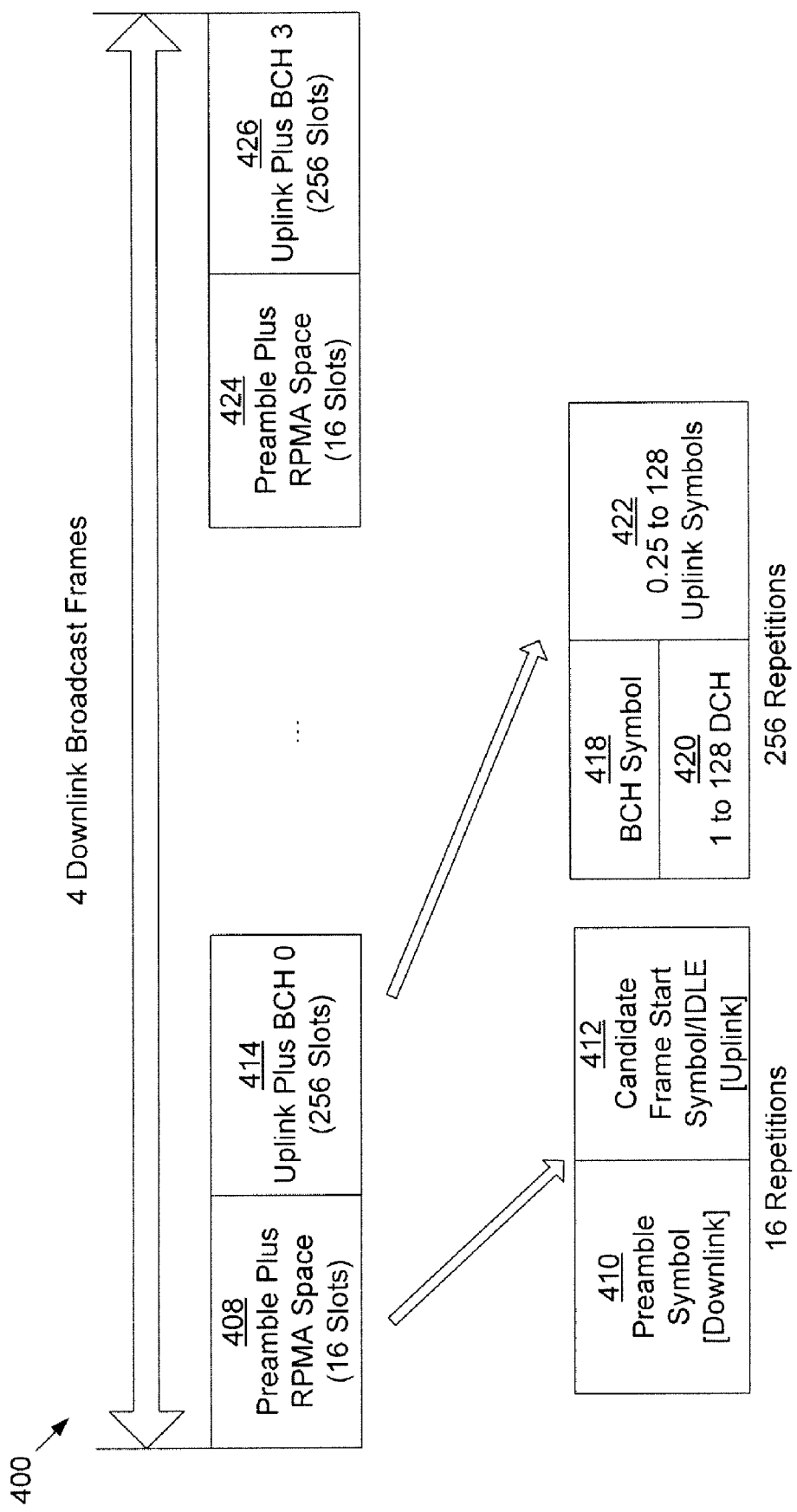
FIG. 4 is a diagram depicting one possible structure for a group of frames that is split into fast slots.

FIG. 4 is a diagram depicting one possible structure for a group of frames 400. The group of frames 400 is broken down into multiple fast slot groups which improves power control characteristics of the system as a whole. A first fast slot group is a preamble plus RPMA space group 408 which is composed of sixteen repetitions of a preamble symbol 410 matched with an uplink candidate frame start symbol 412. The preamble symbol corresponds to the broadcast preamble 302 of FIG. 3. The uplink candidate frame start symbol 412 allows an uplink transmitter to begin transmission at any one of these 16 symbols in addition to the normal frame symbol where transmission could begin. An increased number of opportunities to begin transmission increases an overall RPMA space by enlarging a pool of possible random timing offsets that each transmitter may choose. Increasing the overall RPMA space increases a maximum number of users an RPMA system can support. When an uplink frame is not starting, such as during idle periods or while in the middle of an uplink frame, the uplink candidate frame start symbol 412 is idle. Next, an uplink plus broadcast channel 0 group 414 is shown. The uplink plus broadcast channel 0 group 414 is composed of 256 repetitions of a downlink broadcast channel symbol 418 and a downlink data channel symbol 420 matched with up to 128 uplink symbols 422. In the diagram, the group structure is repeated such that there are four preamble plus RPMA space groups and four uplink plus broadcast channel groups, ending in a preamble plus RPMA space group 424 and an uplink plus broadcast channel 3 group 426. This arrangement shows how uplink and downlink frames correspond in time at a downlink broadcast channel spreading factor of 2048 and an uplink spreading factor of 8192. At those spreading factors, there are four downlink broadcast frames for every uplink data frame. Each uplink plus broadcast channel group is composed of uplink fast slots containing one broadcast channel symbol and 1 or more data channel symbols, depending on the spreading factor chosen for the data channel. At an uplink spreading factor of 8192, each uplink plus broadcast channel group is also composed of one quarter of an uplink symbol. At a downlink spreading factor of 2048 and an uplink spreading factor of 8192, four broadcast channel frames are transmitted for every uplink frame transmitted. Other uplink spreading factors, downlink broadcast channel spreading factors, and downlink data channel spreading factors are possible. Overall, a chosen spreading factor controls a duration of time required to transmit a frame since each frame is composed of an identical number of symbols. This concept is considered further in FIG. 5.

Figure 5:
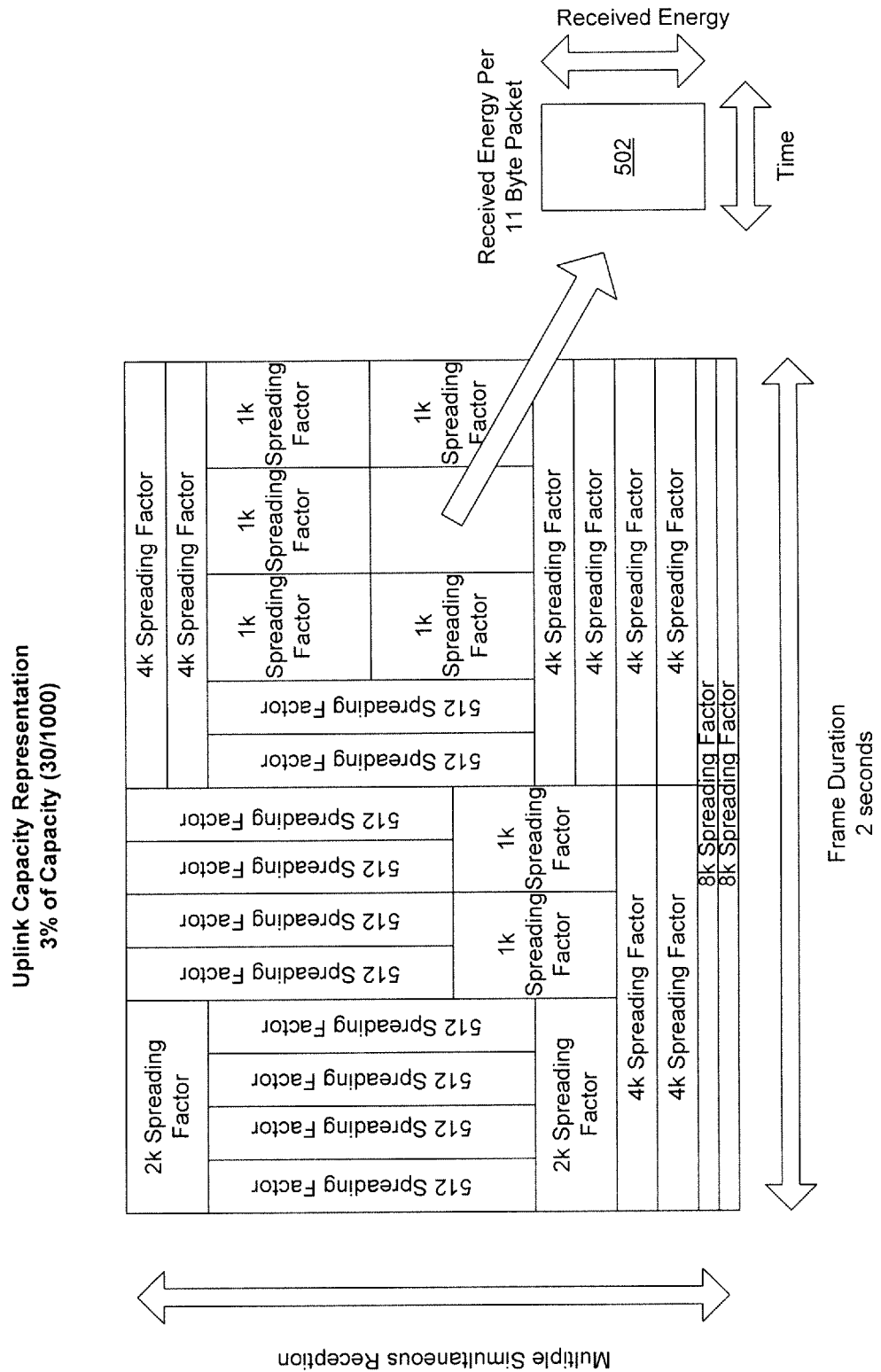
FIG. 5 is a diagram depicting frequency usage in a partially loaded RPMA system.

FIG. 5 is a diagram depicting frequency usage in a partially loaded RPMA system. The vertical axis in the diagram shows received energy, as well as which packets are received simultaneously. The horizontal axis shows time and indicates a frame duration. Many individual packets are shown, each labeled with their spreading factor. In this example, a power received at an access point of each individual packet, such as packet 502, is equal to every other, and is represented by identical areas covered by other packets. This diagram shows uplink capacity at 3% usage, though other usages are possible. Packet 502 shown is an example packet of 11 bytes, though other sizes are possible. Frame duration in this example is 2 seconds, though other durations are possible. Spreading factors listed are representative of many possible spreading factors that would work with this system. Random time offsets are a relatively small part of each transmission and are not shown.

Figure 6:
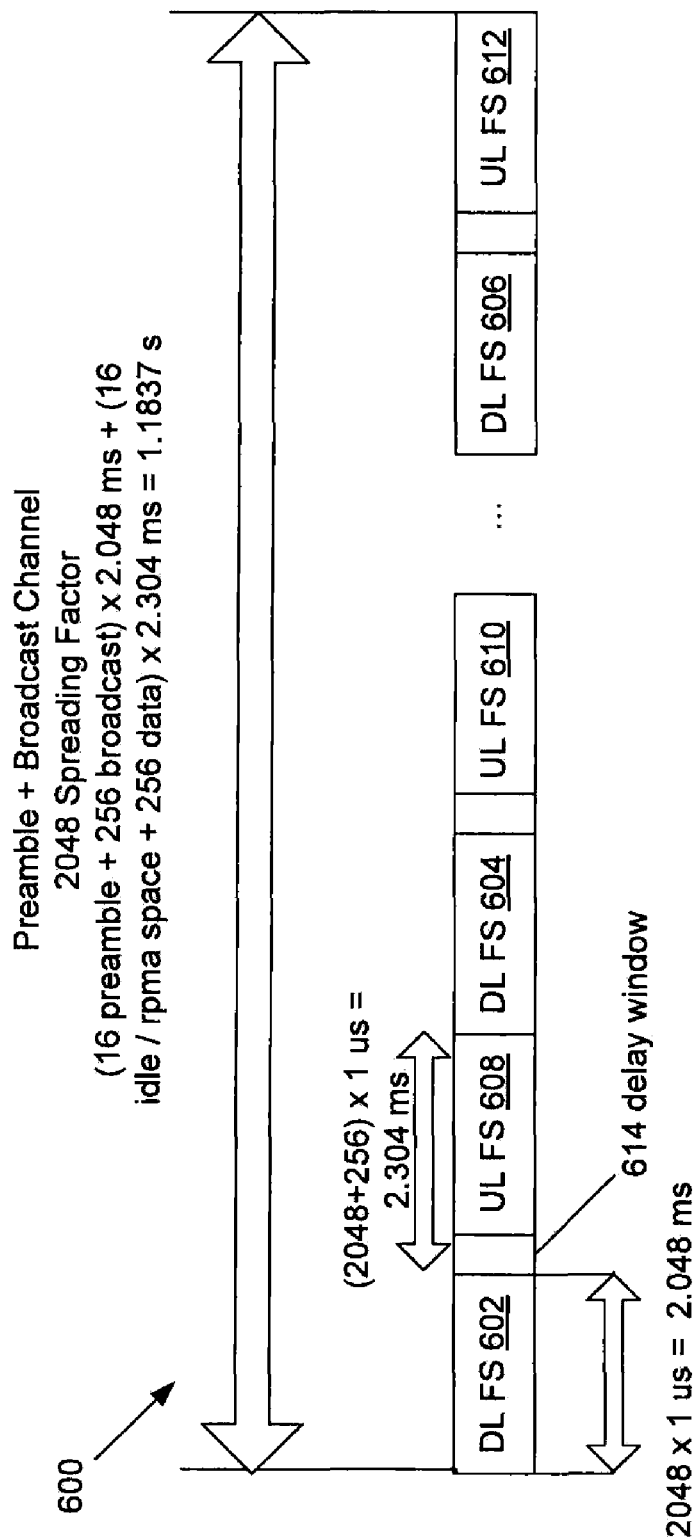
FIG. 6 is a diagram illustrating an example of a preamble and broadcast channel frame 400 broken into fast slots and delay windows including delay window with fast slots for communication that are one symbol in size.

FIG. 6 is a diagram illustrating an example of a preamble and broadcast channel frame 600 broken into downlink fast slots 602, 604, and 606, uplink fast slots 608, 610, and 612, and delay windows, including delay window 614, with fast slots for communication that are one symbol in size. A data slot is a period of time in a transmission protocol where a frame of data may be transmitted. A fast slot is a period of time in the transmission protocol where part of a frame of data, or even part of a symbol, may be transmitted. A fast slot may also be large enough to broadcast a complete frame or multiple frames when either a spreading factor is small, frames are small, or when a large fast slot size is chosen. This granularity gives a system designer an ability to tune this system to respond to changing environments. In this example, a signal has been spread with a 2048 spreading factor. Downlink fast slots 602, 604, and 606 are represented. Uplink fast slots 608, 610, and 612 are also represented. Delay window 614 in this representative embodiment is a 256 chip multipath and RPMA delay window. A similar delay window exists before each uplink fast slot. In this example, each symbol is transmitted by 2048 chips each lasting 1 microsecond for a total of 2.048 milliseconds. After a symbol's transmission by an access point is a 256 chip delay window that allows for multipath and random phase multiple access (RPMA) delays. Following the delay window 614, there are 2048 chips for reception by an access point of a received symbol. The delay window 614 plus the uplink fast slot 608 is 2.304 milliseconds. Thus, with a 16 symbol preamble and a 256 symbol frame, a representative embodiment uses a total of 1.1837 seconds for a transmit and receive frame. But, by allowing one received fast slot for each transmit fast slot, the maximum time that a node goes without receiving a signal has been minimized to 2.304 milliseconds. This improves the node's open loop power control. Other spreading factors, chip timing, delay windows may be used in other embodiments. These other factors would change an open loop power control timing. This system allows for power control between a time a transmission is received and a response is transmitted that can be smaller than a time required for a change in propagation characteristics of signals. Note, in this example, uplink and downlink are symmetrical, including extra symbols available in the uplink that are used in downlink as preamble bits, though only the uplink has an RPMA delay window. The description of FIG. 8 herein explains further how extra symbols in the uplink that correspond to the downlink preamble may be used to improve RPMA characteristics of the uplink including improving the number of users a system may support.

Figure 7:
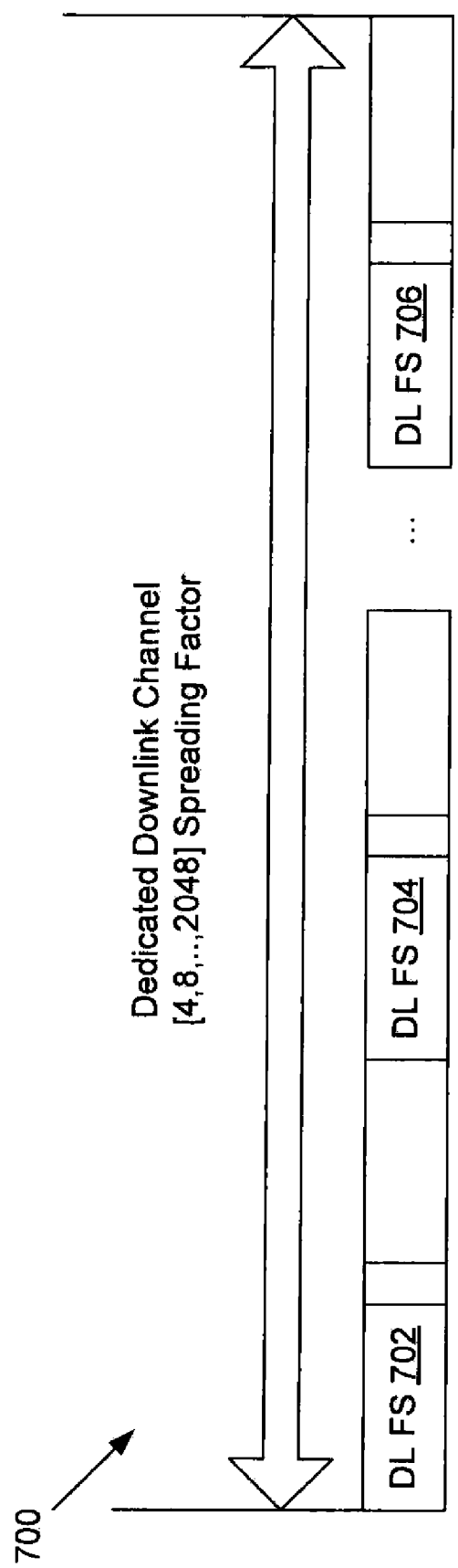
FIG. 7 is a diagram illustrating an example of a dedicated downlink channel frame broken into fast slots with fast slots that are between one symbol and 512 symbols in size.

FIG. 7 is a diagram illustrating an example of a dedicated downlink channel frame 700 broken into downlink fast slots 702, 704 and 706 with fast slots that are between one symbol and 512 symbols in size. A total number of symbols per fast slot is dependent on a spreading factor chosen. Only the downlink fast slots 702, 704, and 706 are labeled to illustrate an advantage of a fast slot system. In one embodiment, a downlink channel may be transmitted as a real component of a complex data stream and a preamble and broadcast channel may be transmitted as an imaginary component of a complex data. Those symbols of a data channel that correspond to a preamble component of a preamble and broadcast channel may be kept idle. If so, a device is free to broadcast the preamble 3 dB higher, making acquisition by nodes easier.

Equally sized fast slots may be used with many different spreading factors simultaneously. When a spreading factor is small, more symbols may be transmitted with the same total receive window size. Each fast slot may be broken down into a number of symbols. With a spreading factor of 128, for example, the fast slot 702 and other fast slots would be composed of 16 symbols. With a spreading factor of 4, each fast slot would be composed of 512 symbols. With a spreading factor of 2048, each fast slot contains only one symbol. With this approach, a 256 chip overhead for the delay window remains unchanged and a measure of efficiency of the system is unaffected. In other embodiments, smaller time periods could be selected by adjusting the number of symbols transmitted in each fast slot.

Figure 8:
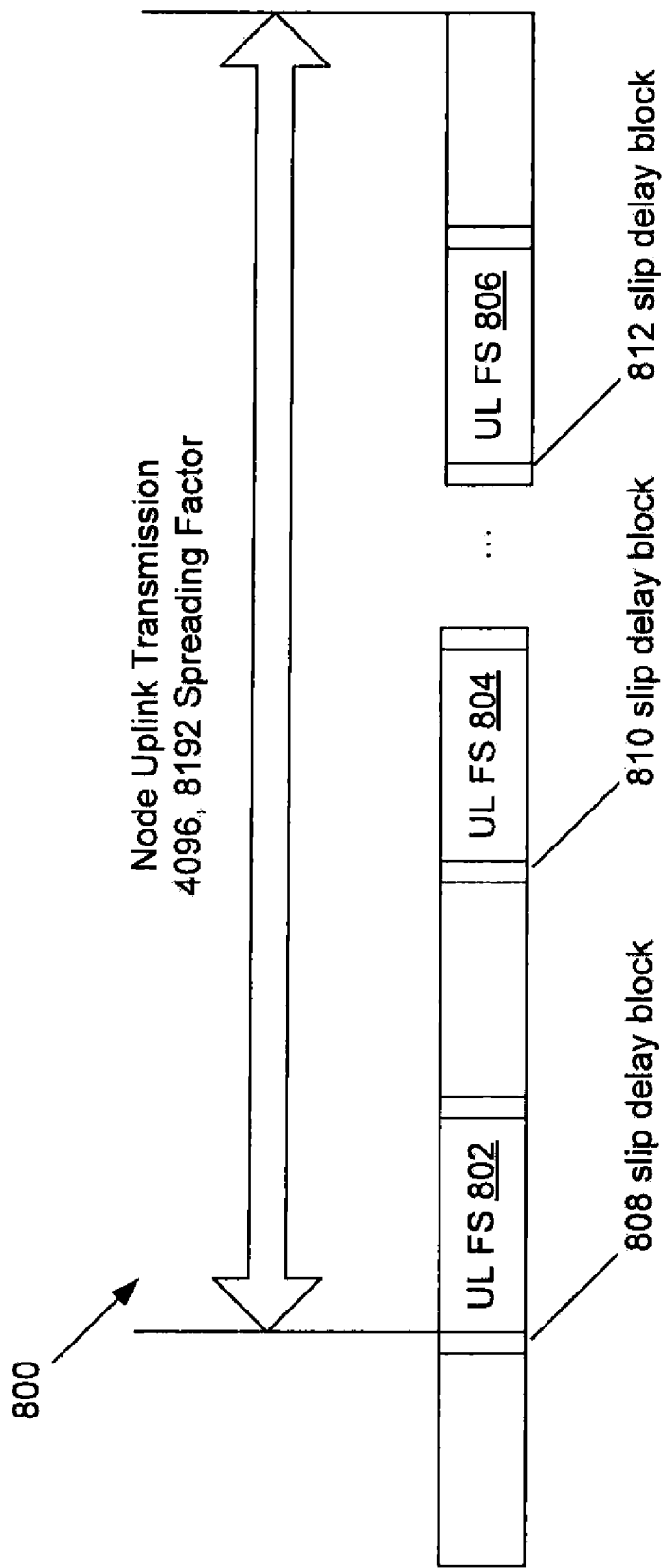
FIG. 8 is a diagram depicting a frame of an uplink communication in an illustrative example including uplink fast slots and multipath and RPMA slip delay blocks when a high spreading factor is used.

FIG. 8 is a diagram depicting a frame 800 of an uplink communication in an illustrative example including uplink fast slots 802, 804 and 806 and multipath and RPMA slip delay blocks 808, 810, and 812 when a high spreading factor is used. A single symbol can be split across multiple fast slots. For example, a symbol with a spreading factor of 8192 would take up four fast slots when a fast slot is 2048 chips large.

FIG. 8 also shows multipath and RPMA slip delay blocks 808, 810 and 812. The multipath and RPMA slip delay blocks 808, 810, and 812, also called delay blocks, are periods of time that a transmitter may insert a random time offset into transmissions. Transmission are delayed by the random time offset such that a time of transmission is dependent on the random time offset. In this representative embodiment, each delay block is the same size, though other sizes are possible. A transmitter may choose identical random time offsets across all delay blocks which correspond to fast slots used to transmit a frame. When the same random time offset is chosen, a receiver's despread array can remain synchronized across each of the fast slots, without needing to redetermine the random time offset.

The diagram in FIG. 8 is from a viewpoint of a node in a communication system. In an RPMA system, the node uses a random delay to give quasi-orthogonality to signals transmitted by other nodes. The node has at least two options for how to select random time offsets which can be used together in order to increase RPMA space available to the communication system. A first option is that the node may select to begin transmission at any time within an RPMA slip delay block. A second option is that the node may choose to begin transmission in any of the uplink fast slots, or may begin transmission in any of a restricted range of the uplink fast slots. For example, when uplink and downlink frame size is kept symmetrical, 16 symbols of an uplink that correspond to a downlink preamble may also be used for a random time offset. These techniques increase the number of nodes that a system can handle by increasing an overall dimensionality of the RPMA space.

The diagram in FIG. 8 illustrates a frame of communication in an exemplary system with multipath and RPMA slip delay blocks between each fast slot. This approach might be used when symmetry is required, such as when both uplink and downlink devices transmit with RPMA. Alternatively, with such a system, RPMA space could be increased again by having an uplink able to use both multipath and RPMA slip delay blocks. Also, since a time period between transmission by a node and transmission time by an access point is kept short, open loop power control can compensate for recent variations in signal propagation characteristics. This power control may be performed by a node to avoid desensing a receiver at an access point to transmissions by other nodes. Power control granularity may be improved by decreasing this turn around time through using smaller fast slots.

Figure 9:
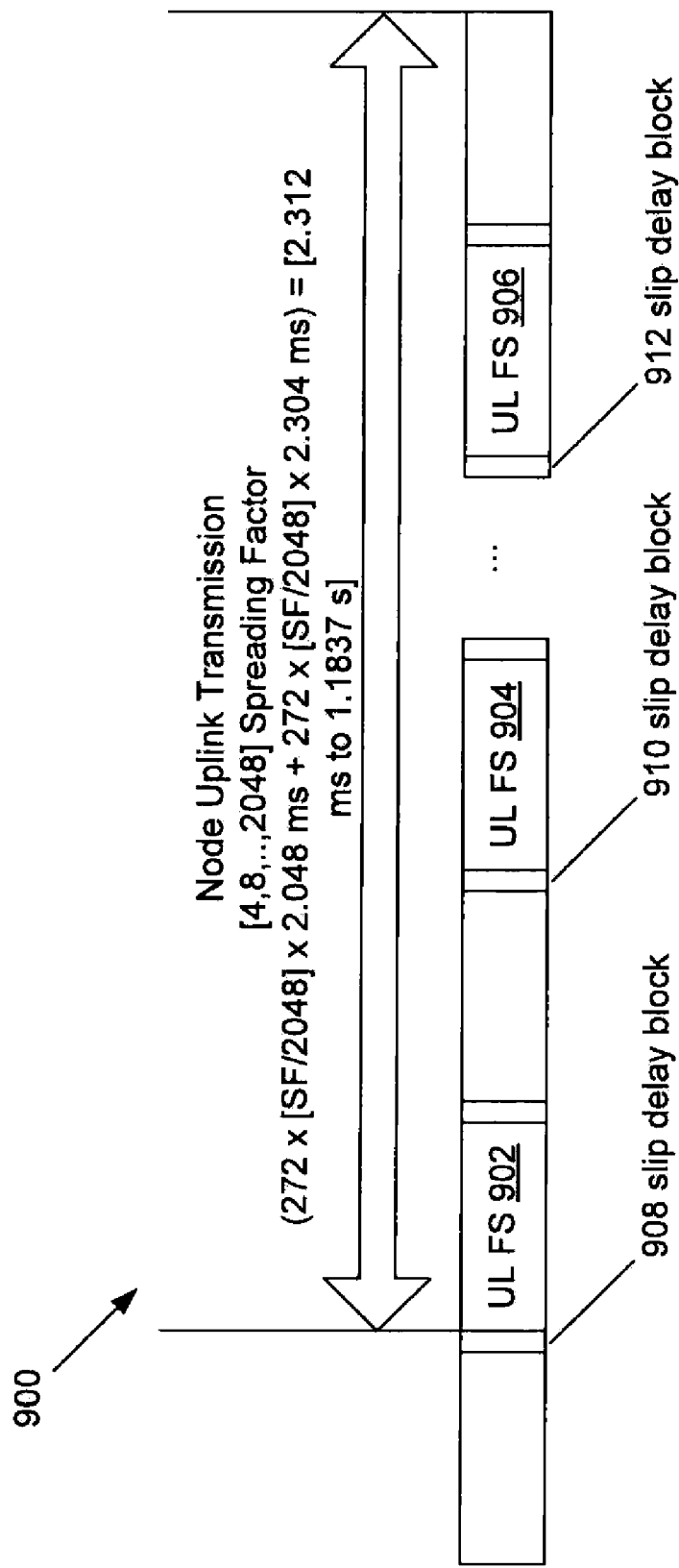
FIG. 9 is a diagram depicting a frame of an uplink communication from a node in an illustrative example including uplink fast slots and multipath and RPMA slip delay blocks when a lower spreading factor is used.

FIG. 9 is a diagram depicting an illustrative example of a frame 900 of an uplink communication from a node including uplink fast slots 902, 904 and 906 and multipath and RPMA slip delay blocks 908, 910, and 912 with a spreading factor of between 4 and 2048. In an exemplary case, a frame 900 is 256 symbols large and is prepended with a preamble that is 16 symbols large for a total of 272 symbols. A frame 900 may be transmitted over a variable number of fast slots since the spreading factor may change. In the exemplary case, downlink fast slots take 2.048 milliseconds to transmit and an uplink fast slot take 2.304 milliseconds to transmit. Thus, at a spreading factor of 2048 where there is one fast slot for each symbol, a frame takes 1.1837 seconds to transmit. Similarly, at a spreading factor of 4, a frame takes 2.312 milliseconds to transmit. A general equation for duration of a frame is given by an uplink duration plus a downlink duration. The uplink duration is a number of symbols to be transmitted times a spreading factor divided by a number of chips per fast slot times a number of seconds per uplink fast slot. The downlink duration is a number of symbols to be transmitted times a spreading factor divided by a number of chips per fast slot times a number of seconds per downlink fast slot. Actual transmission of a frame only occurs during approximately half of that time period because the exemplary case is half duplex. Hence, the duration of a frame is the uplink duration plus the downlink duration. Regardless of whether a large spreading factor or a small spreading factor is used, the time between uplink communication and downlink communication remains small meaning power control may occur frequently.

Figure 10:
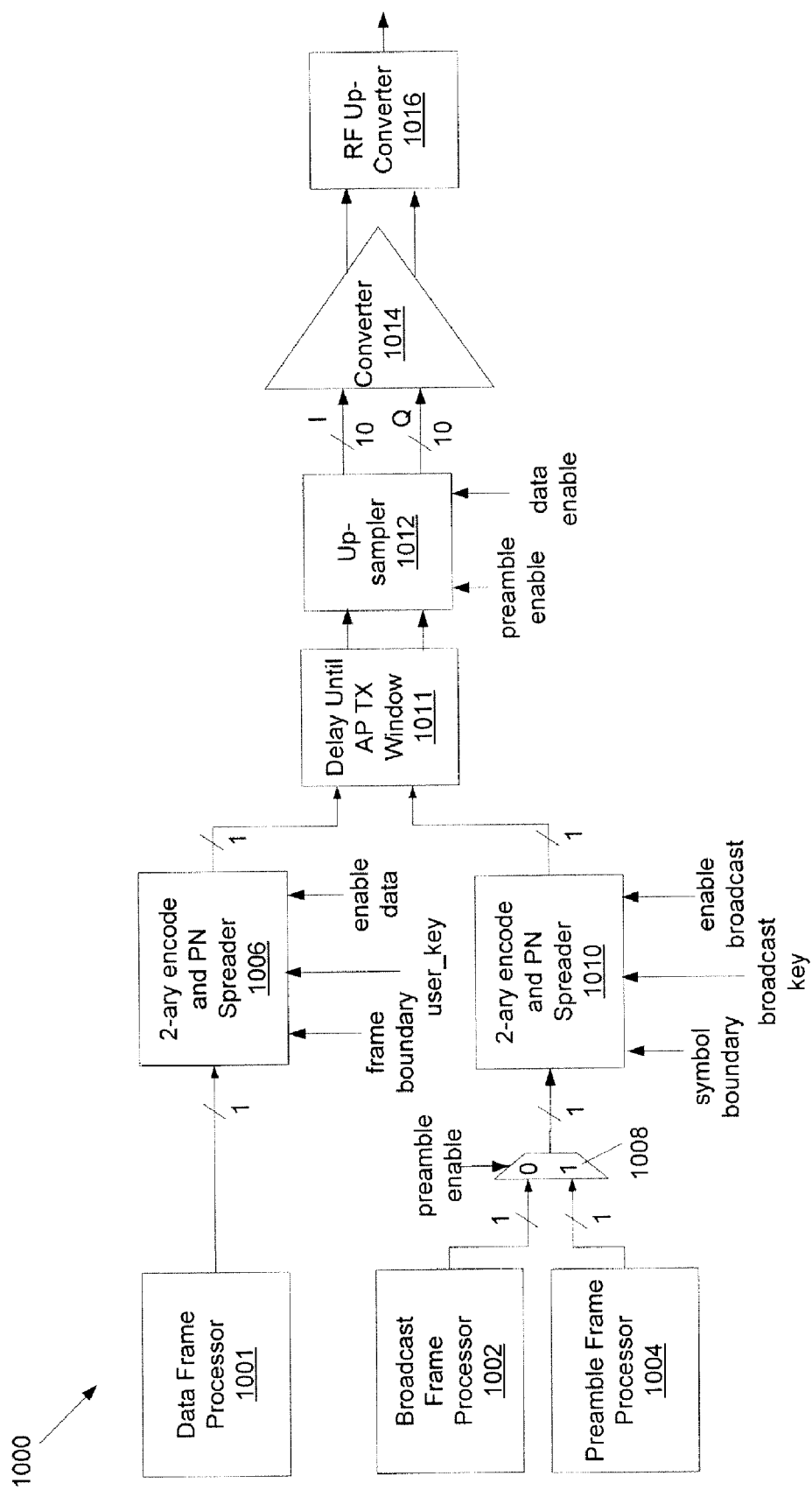
FIG. 10 is a block diagram illustrating a representative access point transmitter capable of transmitting using a fast slotted technique described.

FIG. 10 is a block diagram illustrating a representative access point transmitter 1000 capable of transmitting using a fast slotted technique described. Other transmitter topologies and technologies are possible. Blocks 1001, 1002 and 1004 construct components of a frame. Spreader 1006 modulates and spreads the frame. Selection logic 1008 gates a broadcast frame and preamble frame to broadcast channel spreader 1010. In this transmitter, a 2-ary modulation technique is used, which gives improved response to phase noise. Other modulation techniques are possible. The frame is delayed in block 1011 for an appropriate downlink transmit fast slot. Another technique for introduction of a delay would be to gate a modulation. Alternately, the access point transmitter 1000 could operate synchronously, or implement the delay by some other means. The frame passes through up-sampler 1012 and converter 1014 before being up-converted for transmission in block 1016. The system allows a resulting signal to be boosted by 3 dB during a preamble. The resulting signal is than transmitted to receivers of nodes.

Figure 11:
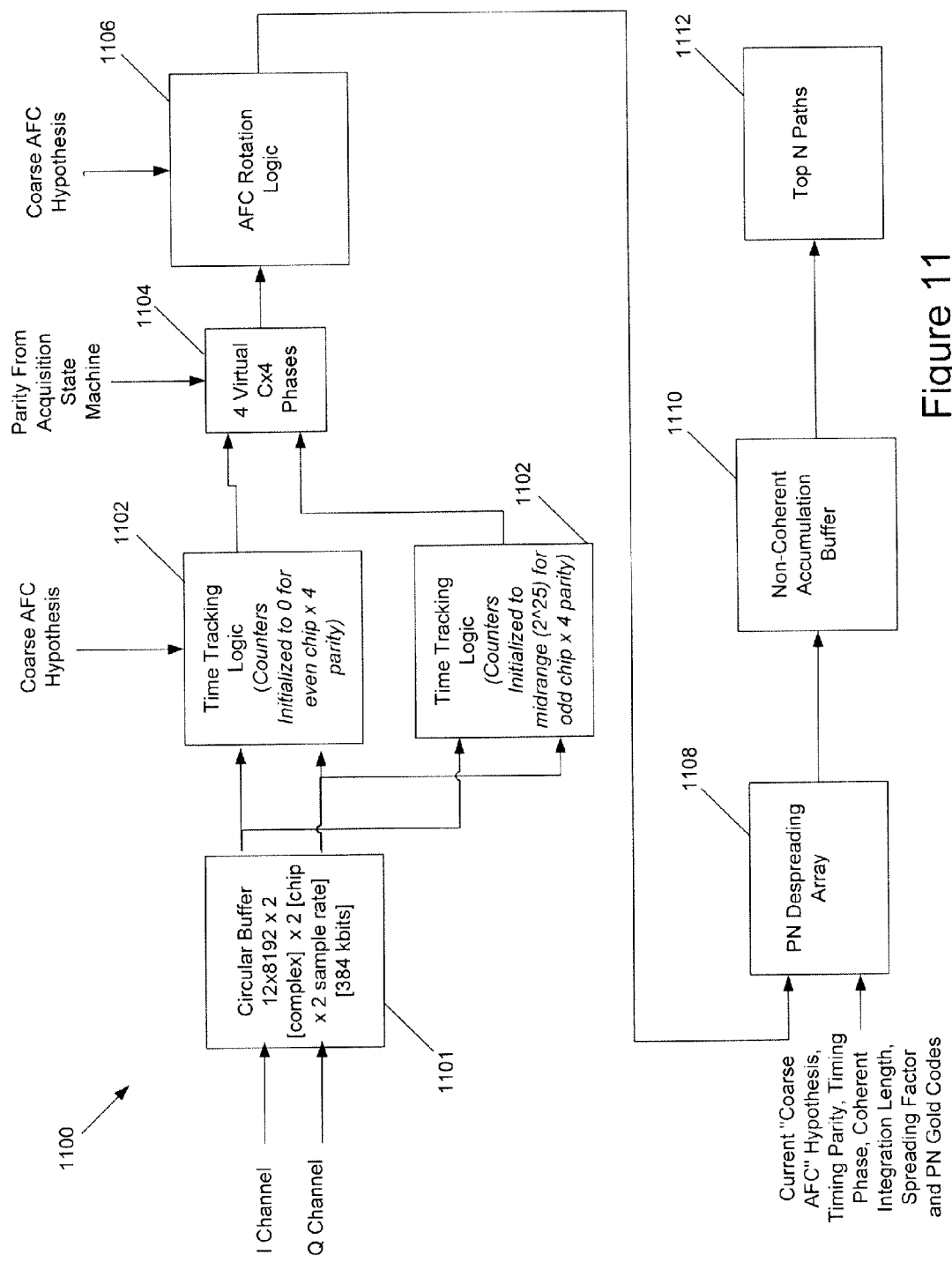
FIG. 11 is a block diagram depicting a node receive data path, focusing on the node's timing acquisition processing, in accordance with a representative embodiment.

FIG. 11 is a block diagram depicting a node receive data path 1100, focusing on a node's timing acquisition processing, in accordance with a representative embodiment. As shown, one-bit complex samples are buffered in a circular buffer 1101 such that enough data is present to make reliable detection of valid energy. Representative values of a buffer topology are provided in circular buffer block 1100. For example, one embodiment buffers 12 symbols. In alternative embodiments, other values may be used. Samples may be input from an I channel and Q channel into this circular buffer scheme at a synchronous sample rate of chip×2 or 2 MHz. Alternatively, other rates may be used. At a fast asynchronous clock, these samples are used to explore various coarse AFC hypotheses. Based on a current coarse AFC hypothesis, time-tracking is performed at chip×4 resolution in time tracking logic 1102. Since the same timing reference is used to drive both a carrier frequency and sample clocks on both an access point and a node, a coarse AFC hypothesis with a known carrier frequency can uniquely map to a known rate of time tracking.

In FIG. 11, circular buffer 1100 receives communication signals over an I channel and a Q channel. These signals are sent to time tracking logic 1102. Time tracking logic 1102 also receives a coarse AFC hypothesis and logic 1102 may reset to zero at even chip×4 parity. Time tracking logic 1102 can have two blocks, one with counters initialized to zero for even chip×4 parity, and one with counters initialized to midrange (i.e., 2^25) for odd chip×4 parity. An output of time tracking logic 1102 is provided to a block 1104 in which virtual chip×4 phases are applied. Block 1104 also can receive parity from an acquisition state machine. Automatic frequency control (AFC) rotation logic 1106 is applied to an output of block 1104. AFC Rotation logic 1106 output is passed to PN Despreading Array 1108 described herein. Among inputs to PN despreading array 1108 are a current coarse AFC hypothesis, timing parity, timing phase, coherent integration length, spreading factor, and PN codes used in despreading. With 2-ary modulation, one possible acquisition metric sums together correlations among two PN code sequences and providing that sum as a result. Results from PN despreading array 1108 are used by non-coherent accumulation buffer 1110 to select the top N paths 1112. The number of paths selected depends on a number of factors including space available for demodulation.

Figure 12:
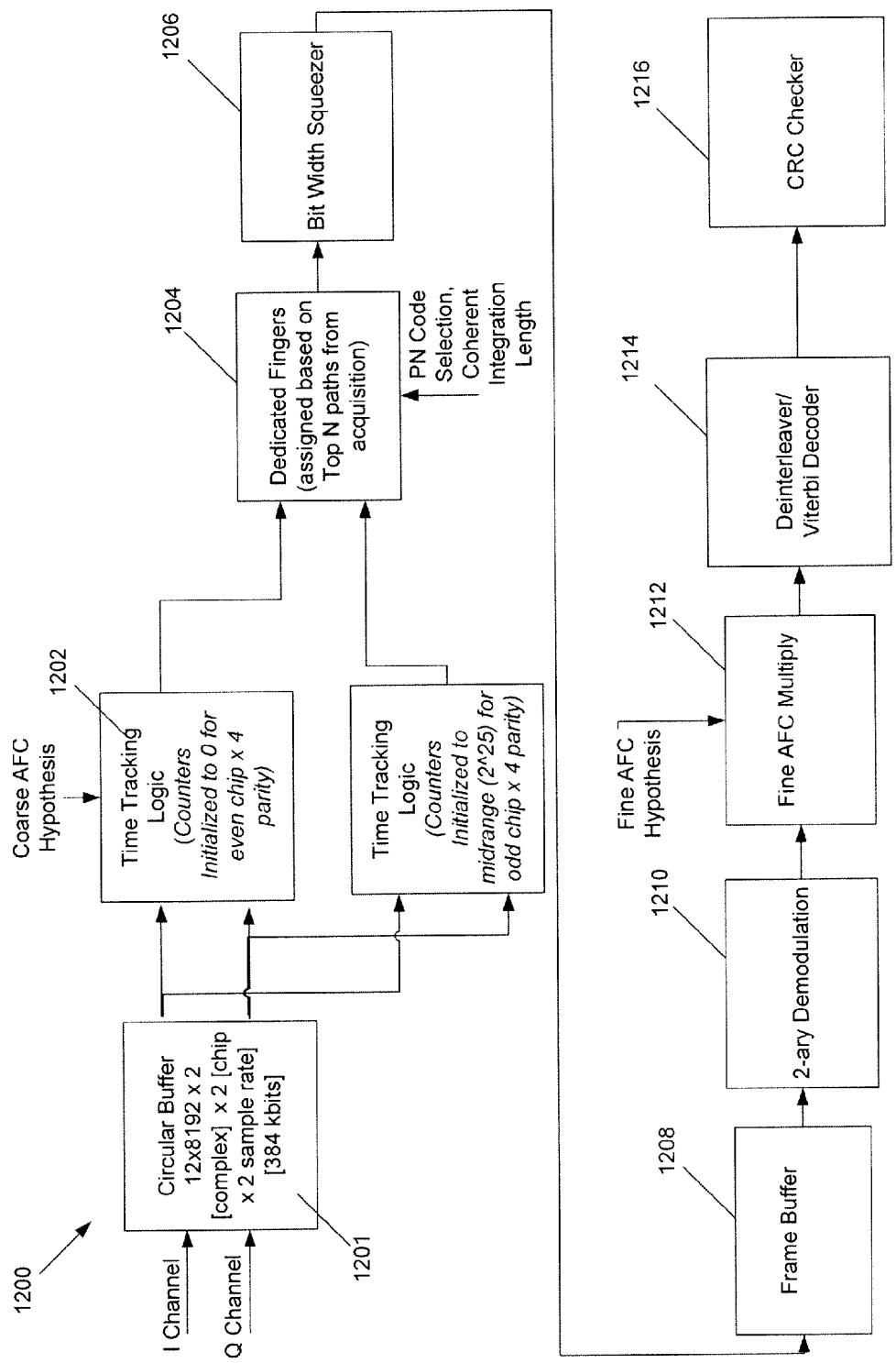
FIG. 12 is an illustration of a node receive path including receive demodulation.

FIG. 12 is an illustration of a node receive path 1200 including receive demodulation. In FIG. 12, circular buffer 1201 receives communication signals over an I channel and Q channel. These signals are sent to time tracking logic 1202 and on to dedicated receiver fingers 1204. Time tracking logic 1202 also receives a coarse AFC hypothesis and logic 1202 may reset to zero at even chip×4 parity. Time tracking logic 1202 can have two blocks, one with counters initialized to zero for even chip×4 parity, and one with counters initialized to midrange (i.e., 2^25) for odd chip×4 parity. Output of time tracking logic 1202 is provided to dedicated fingers 1204 which have been assigned during acquisition as previously described. Dedicated fingers 1204 also receive a PN code selection and a coherent integration length in order to configure demodulation, and is further described herein. Output of dedicated fingers 1204 is passed to a bit width squeezer 1206. Bit width squeezer 1206 output is passed to a frame buffer 1208. Frame buffer 1208 data is demodulated by 2-ary demodulation block 1210. Note that other modulation schemes are possible. The output of 2-ary demodulation block 1210 is passed to fine AFC multiply 1212, which also takes a fine AFC hypothesis as input. Data is then passed to a deinterleaver 1214, which may comprise a Viterbi decoder, and finally to a cyclic redundancy check (CRC) checker 1216. If the CRC checker 1216 determines a CRC is valid, a payload may be sent to a MAC layer. This process is explained further herein.

Figure 13:
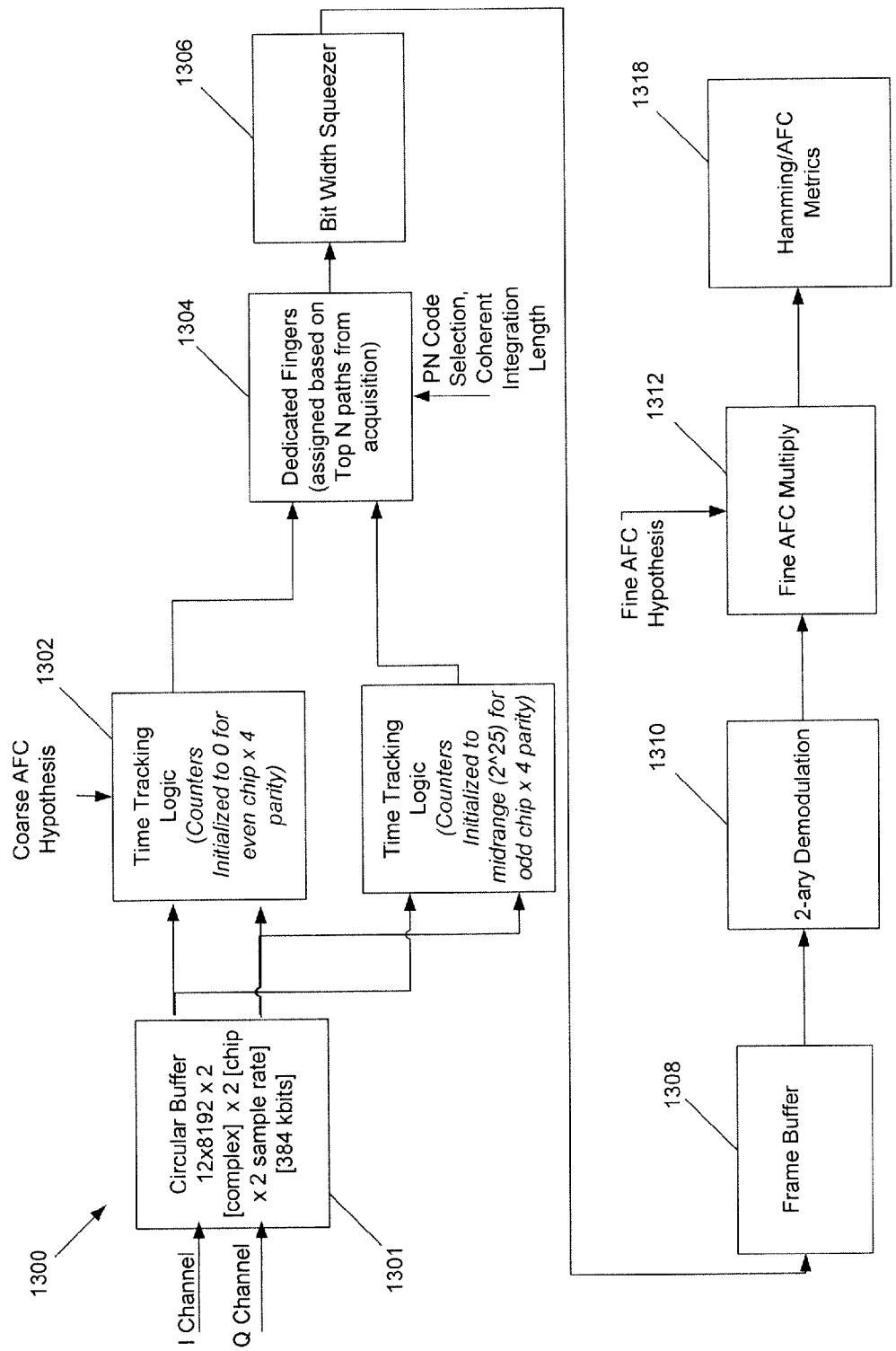
FIG. 13 is an illustration of a node receive path, including preamble processing, which is performed on a boosted preamble while a circular buffer is frozen.

FIG. 13 is an illustration of a node receive path 1300, including preamble processing, which is performed on a boosted preamble while a circular buffer 1301 is frozen. In FIG. 13, circular buffer 1301 receives communication signals over an I channel and Q channel. These signals are sent to time tracking logic 1302 and on to dedicated fingers 1304. Time tracking logic 1302 also receives a coarse AFC hypothesis and logic 1302 may reset to zero at even chip×4 parity. Time tracking logic 1302 can have two blocks, one with counters initialized to zero for even chip×4 parity, and one with counters initialized to midrange (i.e., 2^25) for odd chip×4 parity. The output of time tracking logic 1302 is provided to dedicated fingers 1304 which have been assigned during acquisition as previously described. Dedicated fingers 1304 also receive a PN code selection and a coherent integration length. The output of dedicated fingers 1304 is passed to a bit width squeezer 1306. Bit width squeezer 1306 output is passed to a frame buffer 1308. Frame buffer 1308 data is demodulated by 2-ary demodulation block 1310. Note that other modulation schemes are possible. The output of the 2-ary demodulation block 1310 is passed to fine AFC multiply 1312, which also takes a fine AFC hypothesis as input. Hamming and AFC metrics block 1318 produces results that can be used to determine timing for receive operations and a frequency offset, a spreading factor selection, and other receive parameters for transmit operations. This process is explained further herein.

Figure 14:
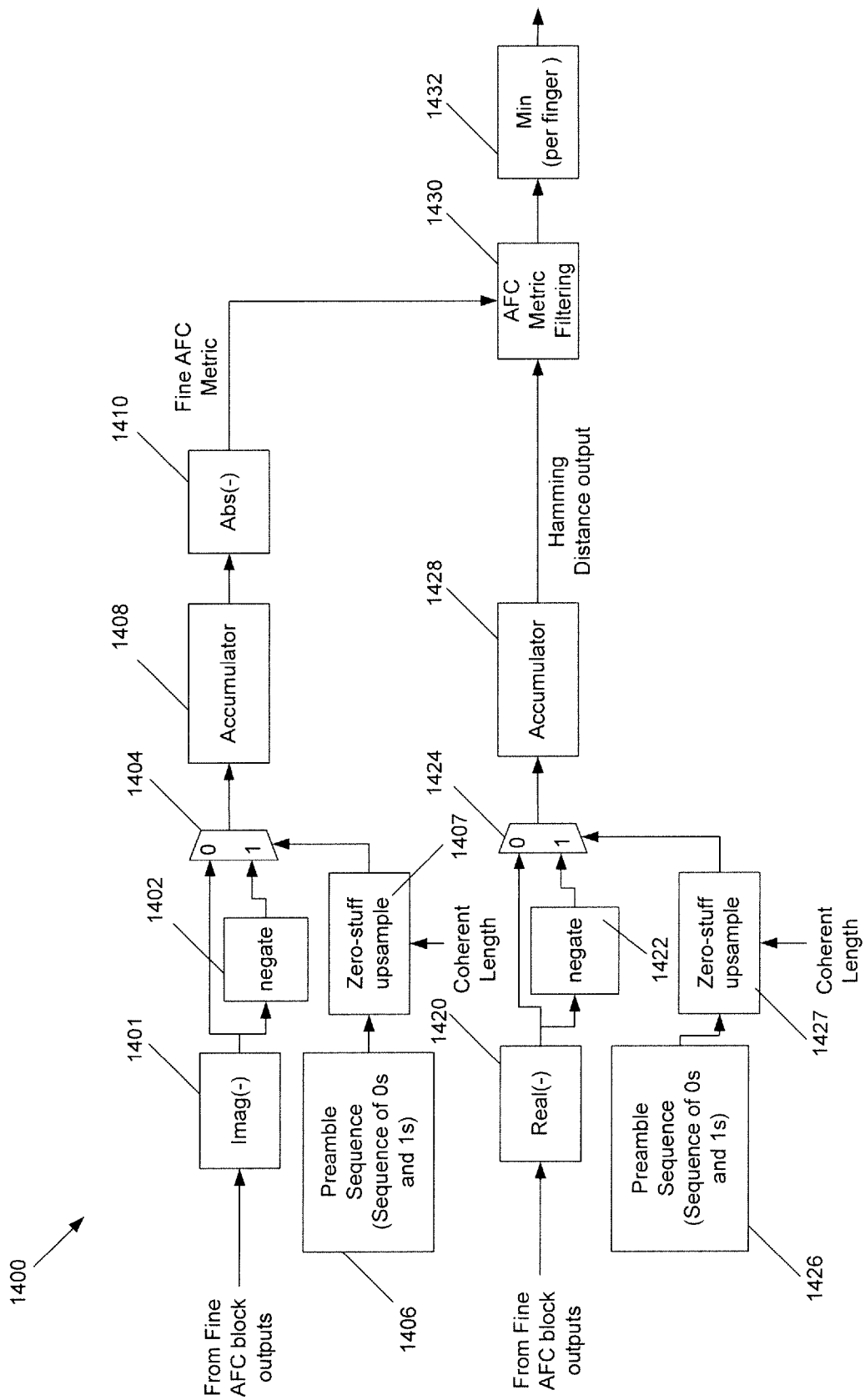
FIG. 14 is a block diagram illustrating an AFC metric determination system for developing a timing for receive operations and a frequency offset for transmit operations.

FIG. 14 is a block diagram illustrating a Hamming and AFC metric determination system 1400 for developing a timing for receive operations and a frequency offset for transmit operations. Hamming and AFC metric determination system 1400 may operate on a boosted preamble and may use the same samples over and over throughout acquisition. Inputs to the Hamming and AFC metric determination system 1400 include a complex output of a fine AFC multiply block, including an imaginary component and a real component. The imaginary component from a fine AFC multiply block is selected in block 1401 and negated in block 1402. Block 1404 selects between outputs of block 1401 and 1402 based on preamble sequence 1406 which is zero-stuffed upsampled in block 1407. Accumulator 1408 sums the output of block 1404 and an absolute value is taken in block 1410 to form a fine AFC metric. Similarly, the real component from the fine AFC multiply block is selected in block 1420 and negated in block 1422. Block 1424 selects between the output of block 1420 and 1422 based on preamble sequence 1426 which is zero-stuffed upsampled in block 1427. Accumulator 1428 sums the output of block 1424 to form a hamming distance output. After each AFC hypothesis is subsequently tested, accumulator 1408 and accumulator 1428 are reset.

The functioning of the Hamming and AFC metric determination system 1400 can best be understood by consideration of examples. In general, the sign of a correctly chosen fine AFC is related to the preamble sequence. When a receiver has been configured such that there is little AFC drift, an optimal coherent integration length has been chosen, and a finger timing has been properly aligned via acquisition, then a real portion of the fine AFC output resembles a preamble sequence in its sign. Thus, for instance, if the sign a sequence of outputs from the real component of the fine AFC output is ++−+ and a preamble sequence consists of 0010, then the two sequences correspond and a high accumulated value at accumulator 1428 will be generated. In another example, the effect of a coherent integration length that is smaller that a spreading factor can be seen. When a coherent integration length is half of a base spreading factor of a broadcast channel, the preamble sequence is zero-stuffed upsampled in blocks 1407 and 1427 such that a preamble sequence of 0010 would become 00001000. On the other hand, if the coherent integration length was equal to the base spreading factor, operation 1407 and operation 1427 would do nothing to the preamble sequence. A corresponding imaginary component of the fine AFC output should be random compared to the preamble sequence when the fine AFC is a proper value, an optimal coherent integration length is chosen, and a finger has been properly aligned via acquisition. The imaginary component is random because no signal is modulated on a quadrature arm of a constellation. Hence, demodulation produces only noise. Accumulating that output will produce a value close to zero. Thus, an absolute value of an accumulated value at accumulator 1408 is small.

AFC metric filtering block 1430 passes on those fine AFC Metrics which have hamming distance outputs that exceed some threshold as well as exceed some multiple of the fine AFC Metrics. Finally, block 1432 gates those fine AFC metrics based on a minimum valid fine AFC metric on a per finger basis. Block 1432 also keeps track of a winning fine AFC index and hamming distance. In alternative embodiments, it is possible for only a hamming distance to be used to determine an optimal fine AFC, timing and coherent integration length. The winning fine AFC index, along with a coarse AFC, coherent integration length, and timing information of fingers, can be used to determine timing and coherent integration length for receive operations, as well as a frequency offset, and a spreading factor for transmit operations. This process is described further herein.

Figure 15:
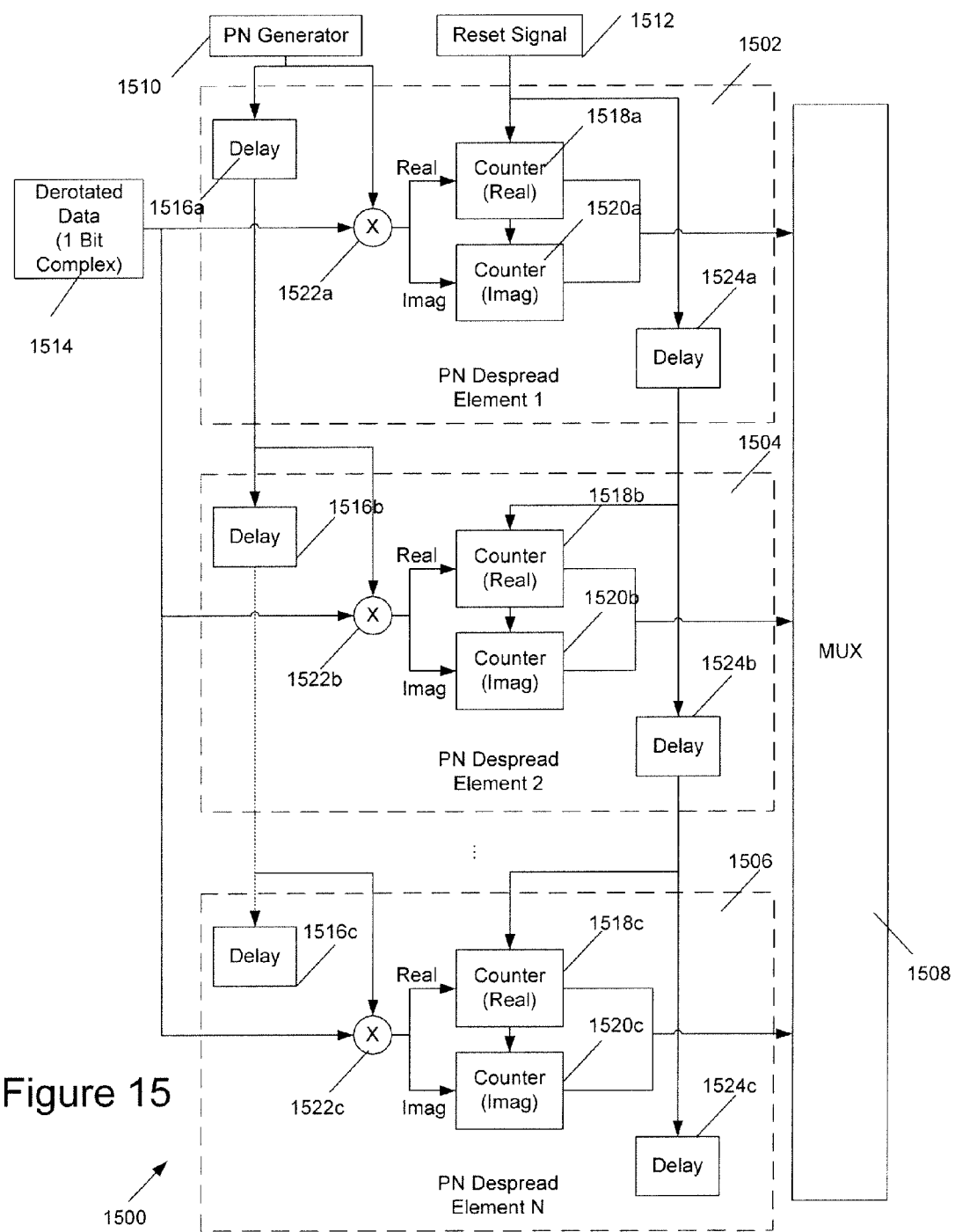
FIG. 15 is a diagram illustrating a PN despread array composed of PN despread array elements.

FIG. 15 is a diagram illustrating a PN despread array 1500 composed of PN despread array elements 1502, 1504 and 1506. There can be many instantiations (e.g., 256 or more in one embodiment) of each PN despread array element including pairs of counters for a complex despread operation. The PN despread array 1500 can be fed at chip rate with adjacent instantiations of PN despread elements 1502, 1504, and 1506 working on timing hypotheses that are a chip apart. A 1-bit complex data is sent from a block 1514 to elements 1502, 1504, and 1506 where it is combined with a PN code from PN signal generator 1510. PN signal generator 1510 can be hardware that outputs identical sequences of 0s and 1s with which an AP is spreading data. In 2-ary demodulation, the PN despread array 1500 is used to despread symbols using both a "0" PN code and a "1" PN code. Despreading a symbol may be done as two passes, each pass despreading for a different PN code. At element 1502, derotated data is combined (more specifically, 1 bit complex multiplied) with the PN code at a combiner 1522a. Real and imaginary parts of this combination are separately input into counters 1518a and 1520a. Counters 1518a and 1520a shift the bit stream out upon receipt of a reset signal 1512. More specifically, data in the counters 1518a and 1520a is valid just prior to a reset signal. The reset signal forces zeros into both counters. Multiplexer 1508 allows for output of currently valid counters for a finger that has uniquely finished its despreading operation at a particular clock. Other elements in the PN despread array 1500 operate similarly. Element 1522b receives derotated data from block 1514 and combines it with the PN code after a delay is imposed by delay block 1516a in element 1502. Output of element 1522b is entered into counters 1518b and 1520b, which gets shifted out of the counters 1518b and 1520b upon a signal from the reset signal 1512 with an imposed delay from a delay block 1524a. Likewise, element 1506 receives derotated data from block 1514 and combines it with the PN code after a delay is imposed by delay block 1516b in element 1504. The combination is entered into counters 1518c and 1520c, which gets shifted out of the counters 1518c and 1520c upon a signal from the reset signal 1512 with an imposed delay from a delay block 1524b.

After a number of clocks corresponding to a coherent integration length, the PN despread element 1502 has valid data which is selected for output by a multiplexer 1508. The coherent integration length can be as large as a spreading factor and is set according to an acquisition rectangle process described below. Every clock thereafter, an adjacent despread element 1504 or 1506 is available until all data has been output which can occur during a number of clocks corresponding to the coherent integration length plus a number of PN despread instantiations. The PN code that governs operation of this PN despread array 1500 can be a gold code parameterized by a value. In alternative embodiments, other PN codes may be used.

Figure 16:
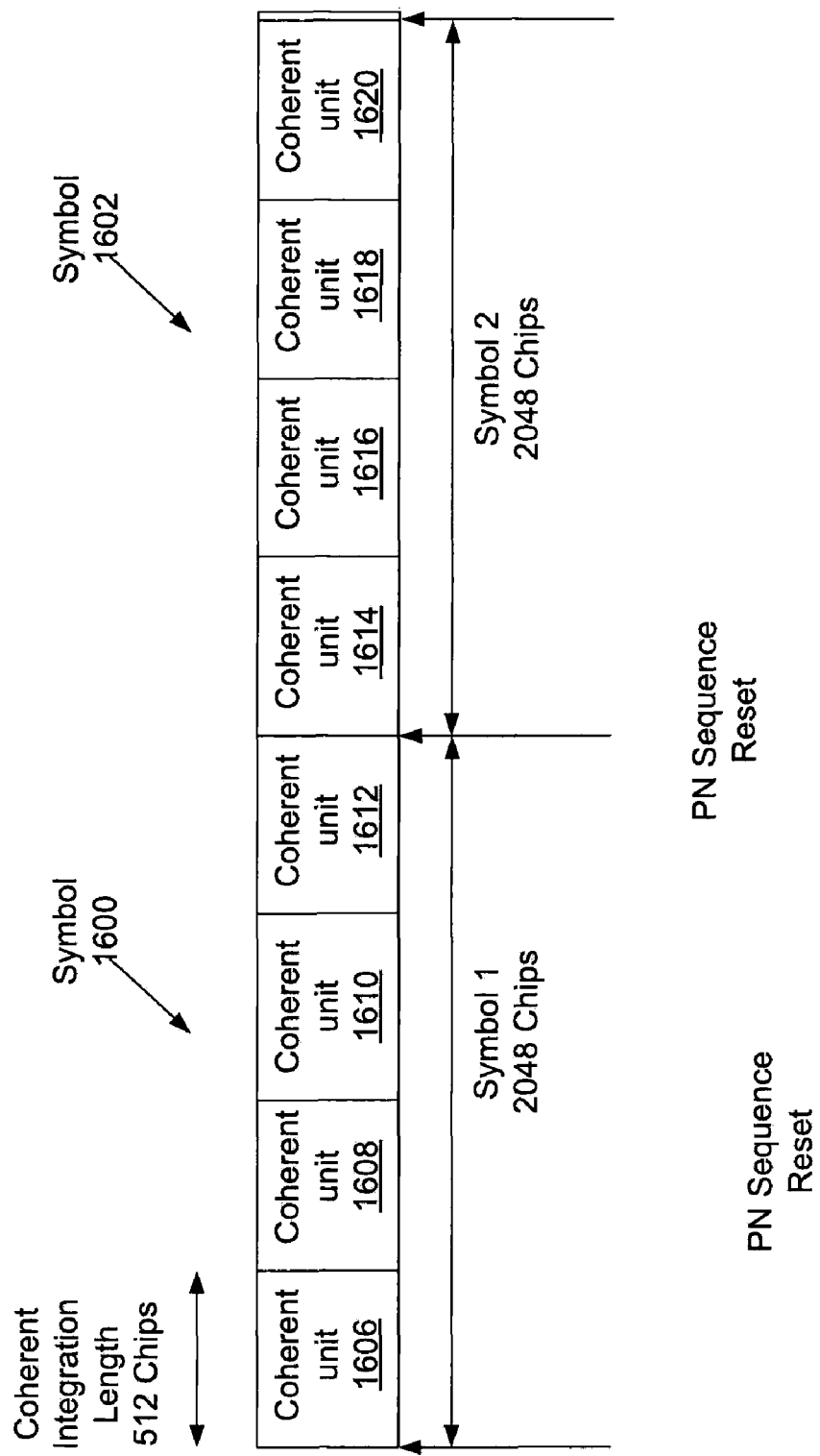
FIG. 16 is a diagram illustrating symbols carried on a signal that has been spread using a PN code and divided into coherent units.

FIG. 16 is a diagram illustrating symbols 1600 and 1602 carried on a signal that has been spread using a PN code and divided into coherent units 1606, 1608, 1610, 1612, 1614, 1616, 1618 and 1620. In the illustration, the signal has been divided into smaller coherent units. Each of symbols 1600 and 1602 on the signal is composed of a number of chips. In the depicted representative embodiment, symbol 1600 is composed of 2048 chips. In alternative embodiments, other numbers of chips may be used. Symbol 1600 may be divided into more or less coherent units. Symbols may be larger or smaller than 2048 chips. More or less symbols may be used in the process. The PN despread array of FIG. 15 may be used to sum these coherent units by providing the counters 1818a and 1820a with a reset signal 1812 for each of the coherent units 1606, 1608, 1610, and 1612. Each of the coherent units 1606, 1608, 1610, and 1612 may then be summed together non-coherently. The non-coherent sum primarily considers a magnitude of the signal carrying the symbol 1600, not data in the symbol 1600. Thus a receiver detects whether energy is available and is more immune to phase differences in a received signal.

Figure 17:
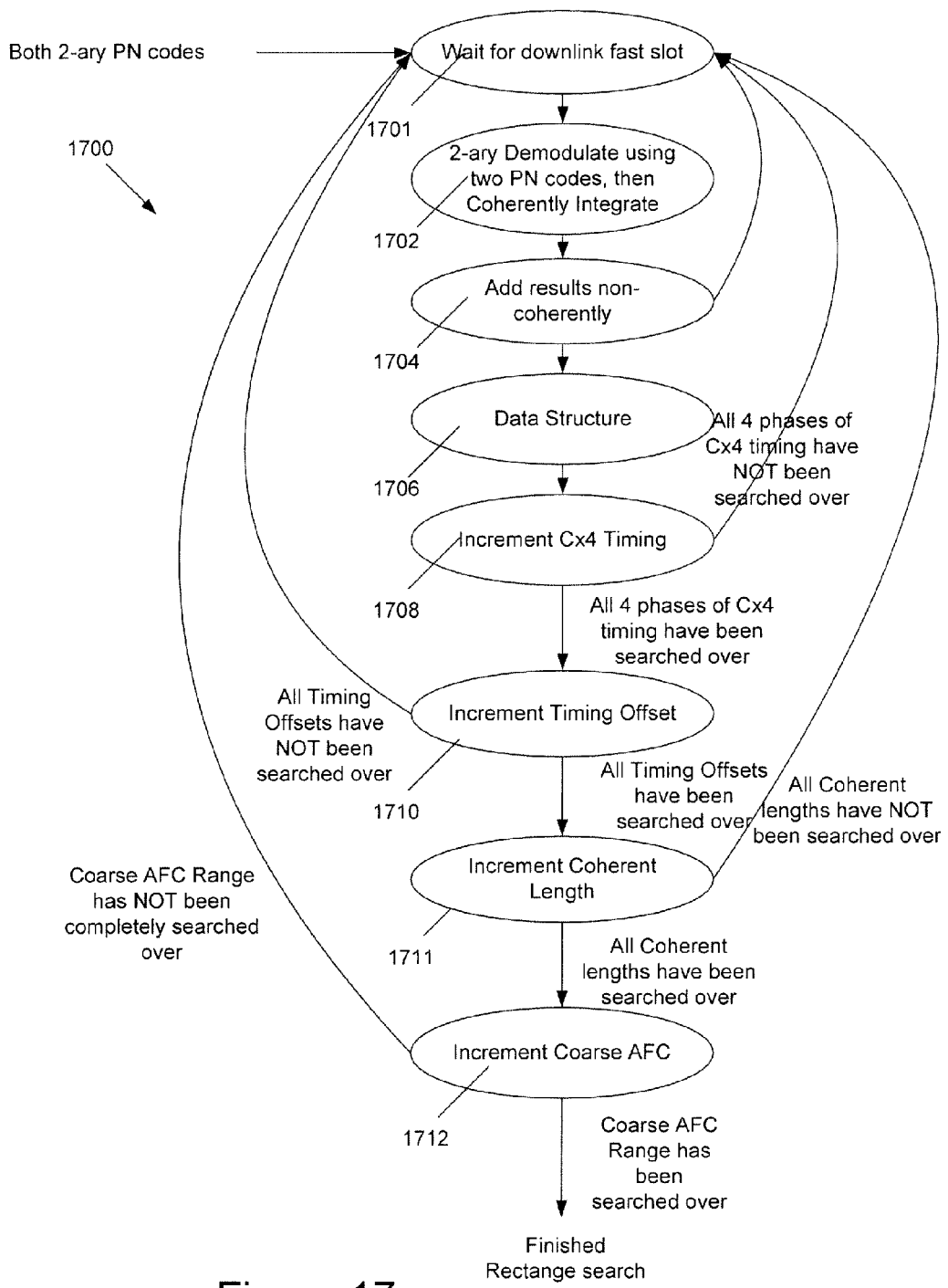
FIG. 17 is a flow diagram depicting rectangle acquisition for signal acquisition and reception.

FIG. 17 is a flow diagram 1700 depicting rectangle acquisition processing described subsequently. Additional, fewer, or different operations may be performed, depending on a particular embodiment. A receiver may performs operations in a different sequence than that shown and described.

First, with a fast slot system as in an exemplary embodiment, a node waits for a downlink fast slot at state 1701. While waiting for the downlink fast slot, the node may save power by keeping receive finger inactive. Once acquired, at state 1702, data is demodulated using both 2-ary PN codes.

Demodulation may be performed as two steps through a PN despreader, one step using a "0" PN code and one using a "1" PN code. A "0" PN code and a "1" PN code are just two different PN codes used to modulate symbols. One of these two codes may produce valid data, since a zero is encoded by one code and a one is encoded by the other code. The node sums data produced by demodulating each 2-ary PN code. Because one coherent despread does not necessarily yield good enough acquisition performance in low SNR, energy is accumulated non-coherently in state 1704. Upon completion of each non-coherent accumulation, a PN despread array is re-entered until a desired number of non-coherent accumulations has been reached. Once non-coherent results are fully accumulated a top N structure shown in state 1706 is updated. The top N structure contains non-coherent energies with accompanying acquisition information of sub-chip timing, chip timing, coherent integration length, and coarse AFC are maintained in this data structure. After the top N structure is written, subchip timing is adjusted by a C×4 phase (at state 1708) and a PN Despread block is re-entered with all non-coherent energies having been reset back to zero. An acquisition process of accumulating energy non-coherently then repeats itself with all C×4 phases being searched over. Once all C×4 phases are complete, chip timing is adjusted by 64 chips and C×4 phase is reset back to zero (at state 1710). This process repeats itself with all four C×4 phases once again being searched over at the adjusted chip timing. Once all timing offsets have been searched over, a coherent integration length is adjusted (at state 1711) and both the timing offset and C×4 phase are reset. Adjusting the coherent length gives processing some resilience to doppler induced signal problems. A doppler induced signal problem may make a longer coherent integration length be longer than the decorrelation time of the channel. Thus, a "best" coherent integration length may be shorter. Similarly, when little doppler induced signal problems are present, a longer coherent integration length will maximize process gain. This approach explores all possible coherent integration lengths. Once a smallest coherent integration length has been searched, the coarse AFC is adjusted (at state 1712) and this process repeats with all chip timings, C×4 phases and coherent lengths being searched over in states 1701, 1702, 1704, 1706, 1708, 1710, 1711 and 1712. This process repeats until every desired coarse AFC within the coarse AFC range has been searched.

Figure 18:
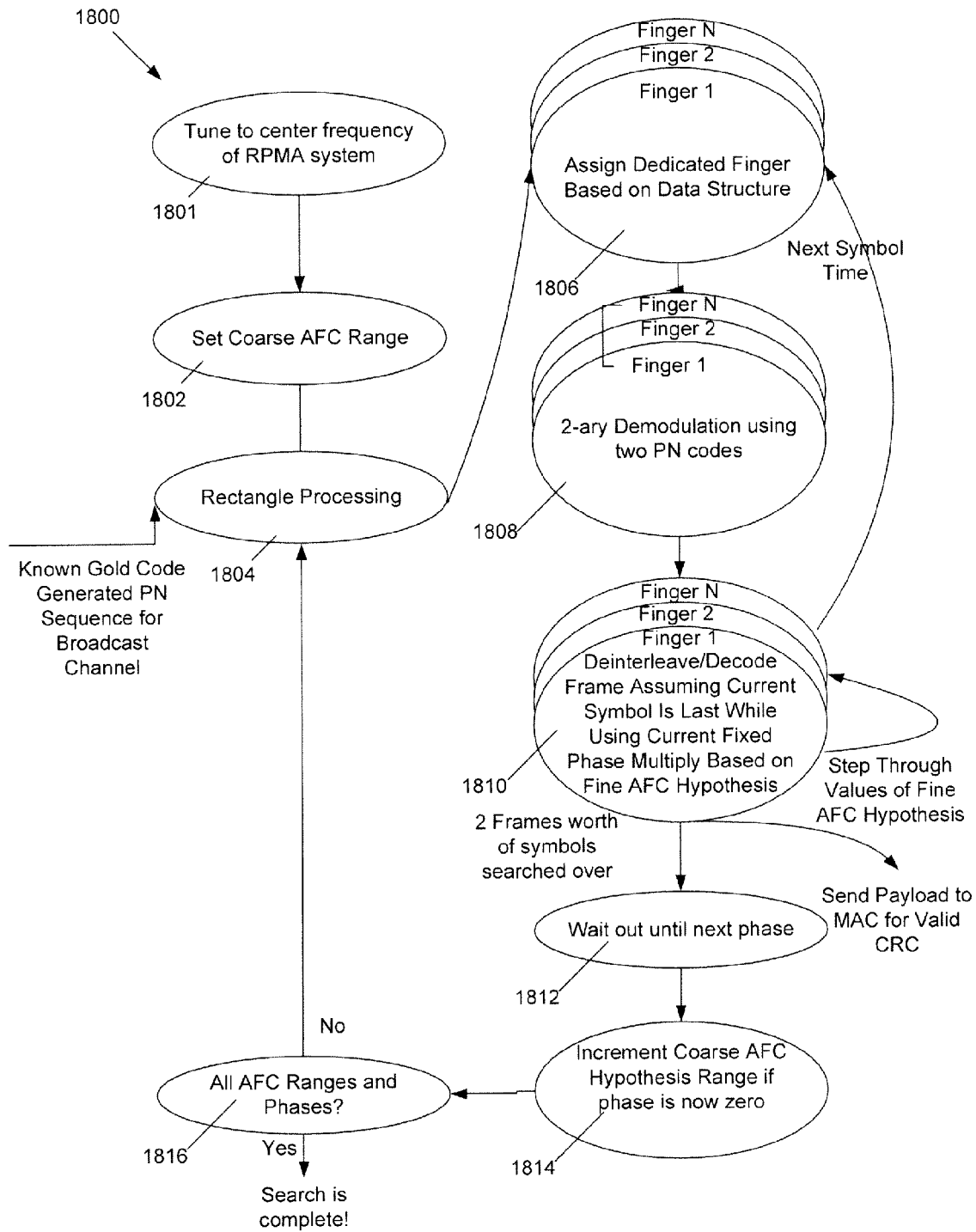
FIG. 18 is a flow diagram depicting operations used to perform cold acquisition in an illustrative embodiment.

FIG. 18 is a flow diagram 1800 depicting operations used to perform a cold acquisition process by a receiver in an illustrative embodiment. In an operation 1801, cold acquisition begins with a modem being turned on and a receive radio being tuned to a center frequency of an RPMA system. In an operation 1802, the receiver sets a coarse AFC range such that an acquisition rectangle completes in one frame duration minus some small delta. In an operation 1804, the receiver performs rectangle processing as described above. Rectangle processing is complete when every desired coarse AFC within the coarse AFC range has been searched.

In an operation 1806, the receiver assigns dedicated fingers based on a data structure. In an operation 1808, the receiver performs 2-ary demodulation. 2-ary demodulation is performed using a PN despreader and two PN codes as described with reference to FIG. 17. When data is being demodulated with the PN despreader, one of the two PN codes will produce a valid output that is incorporated into a frame of data. In an operation 1810, the receiver interleaves and decodes frames. For any valid CRC, the receiver sends a payload to a medium access control (MAC) layer for subsequent use in reception and a frame timing is known. In an operation 1812, frame decoding has taken place over two frame durations and the cold acquisition process times out until a next phase. In an operation 1814, a next coarse AFC hypothesis range is set if the next phase is phase 0. For this illustrative embodiment, this means that a coarse AFC hypothesis range is adjusted every four cycles through this operation. In an operation 1816, the receiver tests whether all AFC ranges and phases have been searched. If not, the receiver goes back to operation 1804 and performs a new rectangle acquisition. If the receiver has tested all AFC ranges and phases, then the cold acquisition process is complete.

Figure 19:
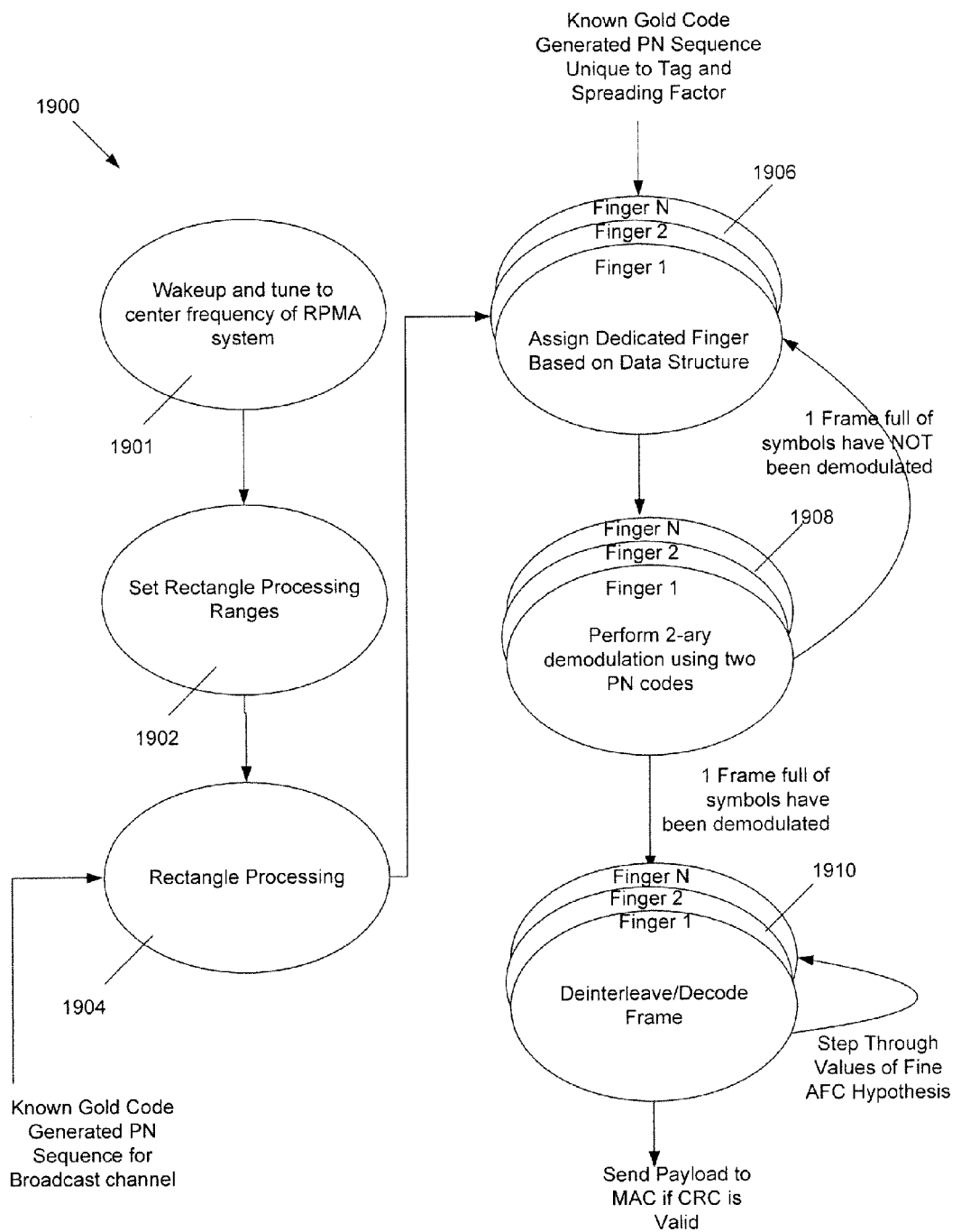
FIG. 19 is a flow diagram depicting dedicated channel processing along with warm acquisition in a representative embodiment.

FIG. 19 is a flow diagram 1900 depicting warm acquisition by a receiver in a representative embodiment. Warm acquisition proceeds along a very similar state path as does the cold acquisition process previously described. This flow diagram 1900 is applied both to broadcast and dedicated data processing. Additional, fewer, or different operations may be performed depending on a particular embodiment. Operations may also be performed in a different sequence than that shown and described.

In an operation 1901, the receiver tunes a radio to an RPMA center frequency. Next, in an operation 1902 a coarse AFC range, timing offset range, and coherent length range are set for a subsequent acquisition search in an operation 1904. Unlike cold acquisition, only one range is set for an entire state process. The receiver performs a rectangle processing search in operation 1904. At operation 1906, the receiver assigns a dedicated finger based on a data structure returned from rectangle processing. The receiver demodulates data received from the dedicated fingers using 2-ary demodulation in operation 1908. 2-ary demodulation is performed using a PN despreader and two PN codes as described in FIG. 17 and FIG. 18. Other modulation techniques are possible. At operation 1910, a frame is deinterleaved and decoded. Finally, a payload of the frame is sent to a MAC if a decoded cyclic redundancy check is determined to be valid. Operations 1906 through 1910 are similar to the cold acquisition process with an exception that only one frame timing is decoded. This is performed when a full frame of symbols have been demodulated. Another difference is that operation 1906 receives a different Gold Code input than that of acquisition, namely a Gold Code of a dedicated channel.

Figure 20:
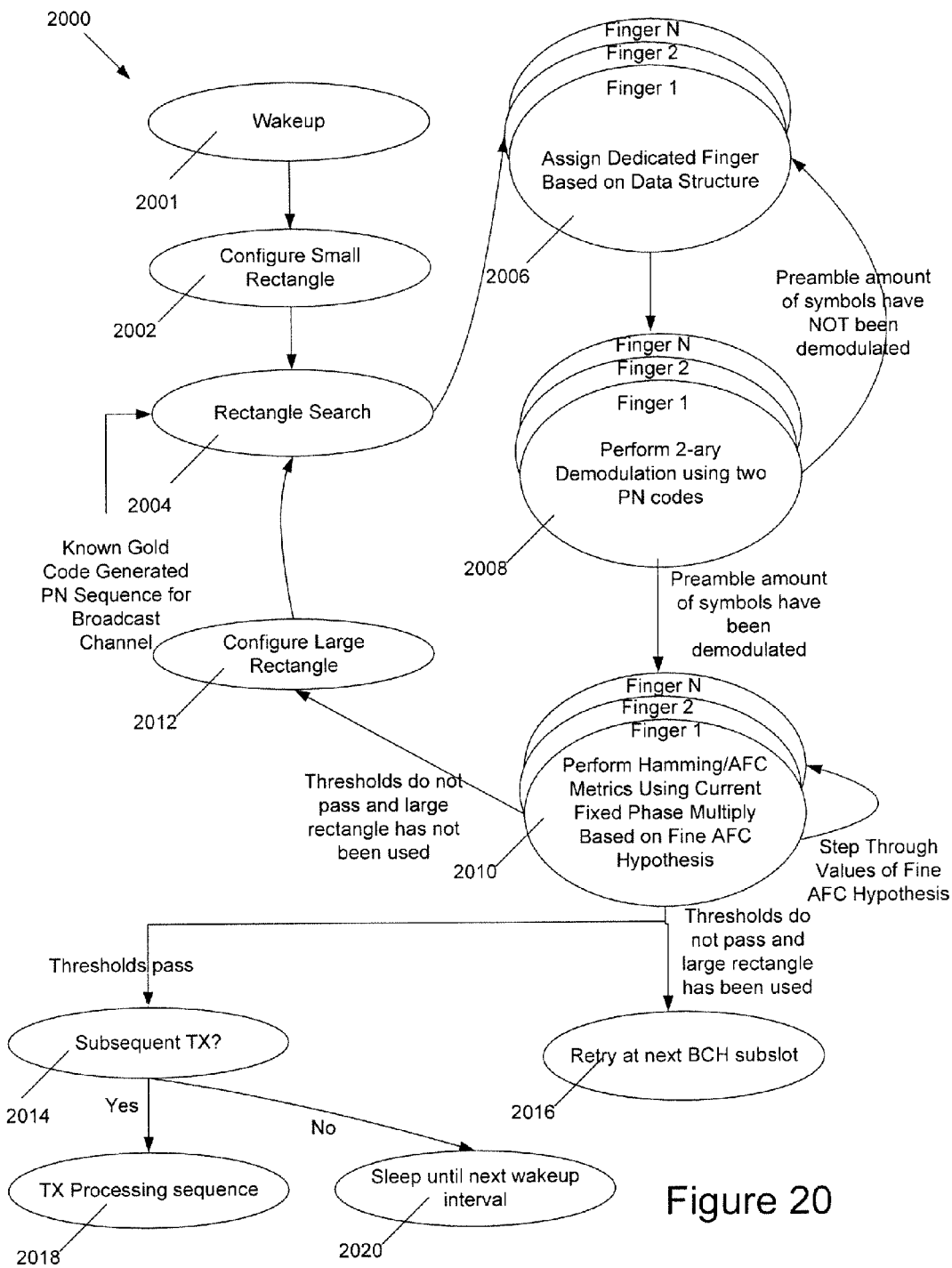
FIG. 20 is a flow diagram depicting preamble processing with and without subsequent transmit operations.

FIG. 20 is a flow diagram 2000 depicting preamble processing with and without subsequent transmit operations. Preamble processing starts along a very similar state path as does dedicated channel processing. Additional, fewer, or different operations may be performed depending on a particular embodiment. Operations may also be performed in a different sequence than that shown and described.

In an operation 2000, a radio wakes up after having been in sleep mode, tunes to an RPMA center frequency, and fills its circular buffer with samples around and containing an over-the-air preamble. Unlike both cold acquisition and dedicated channel processing, once the circular buffer has been filled with sufficient samples for searching the circular buffer is frozen, and each subsequent search takes place over the same set of samples. In an operation 2002, a small rectangle search of coarse AFCs and timing offsets are configured that handles a normal timing drift induced from an inaccurate frequency offset from the radio's frequency source. In an operation 2004, a small rectangle search of an AFC range, timing, and integration length is performed as described above. In an operation 2006, dedicated fingers are assigned according to a top N data structure. In an operation 2008, 2-ary demodulation proceeds until a preamble amount of symbols have been demodulated. 2-ary demodulation is performed using a PN despreader and two PN codes as described in FIG. 17 and FIG. 18. Other demodulation techniques are possible. In an operation 2010, hamming and AFC metrics are calculated for each fine AFC hypothesis.

There are three possible outcomes of the hamming and AFC metrics. If the hamming and AFC metrics are such that thresholds are not passed and only a small rectangle search has previously been conducted, then, in an operation 2012, a large rectangle search of a larger timing offset and coarse AFC range is configured. Integration lengths are configured to be the same as in the small rectangle search. Operation 2004, 2006, 2008 and 2010 are then repeated using the larger timing offset and coarse AFC range rectangle. If the larger rectangle search also yields metrics that do not pass the thresholds, in an operation 2016, any subsequent transmit operation is aborted and preamble acquisition is retried at a next available BCH (broadcast channel) fast slot. This is a second possibility upon exiting operation 2010. In some embodiments, it is possible for more than two different rectangle sizes to be searched over before aborting the preamble acquisition. A third case is that the thresholds pass. In the third case where there is a subsequent transmit operation, a transmit processing sequence occurs in an operation 2018, further illustrated in FIG. 21.

Figure 21:
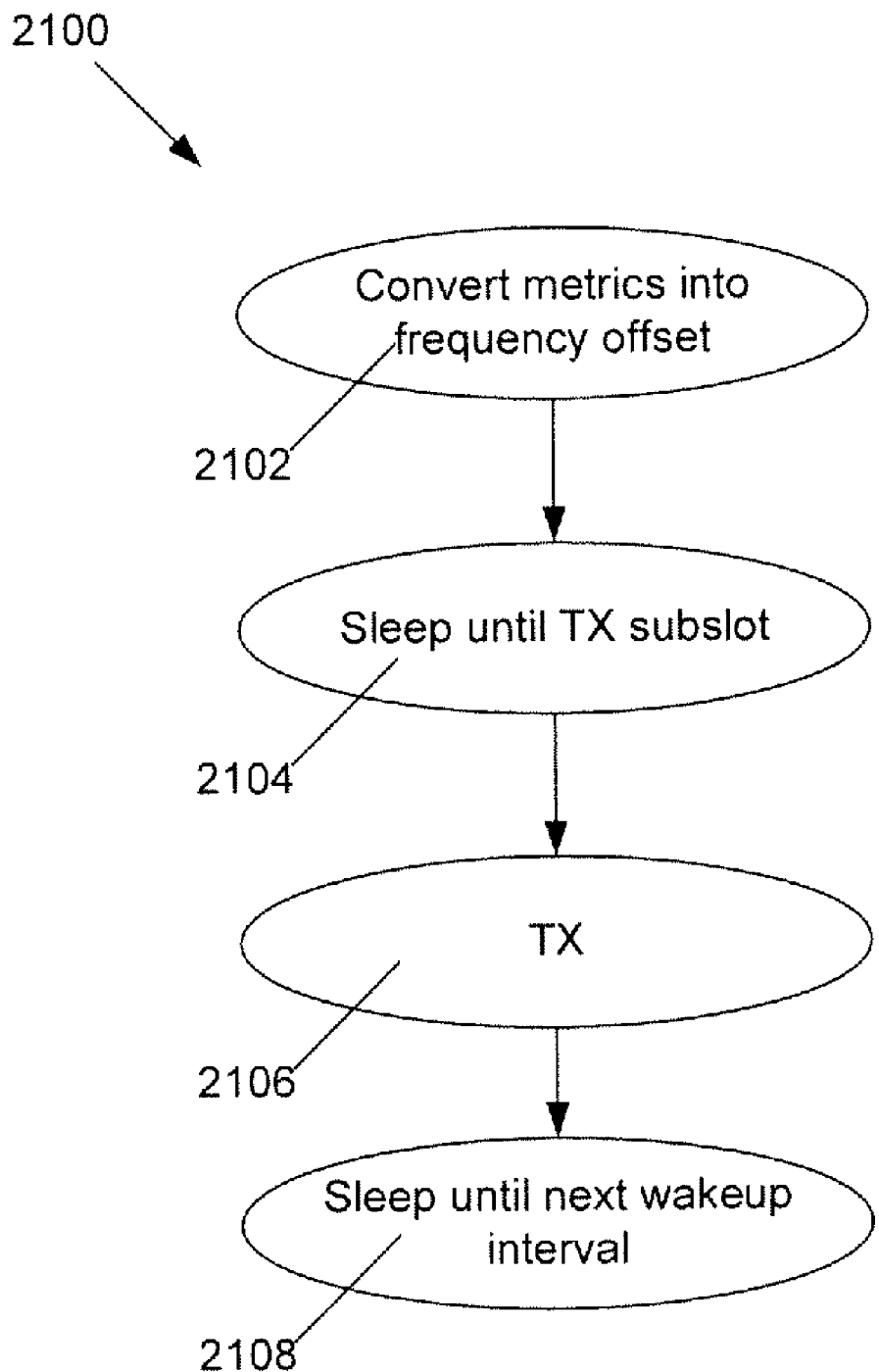
FIG. 21 is a flow diagram depicting transmit processing given metrics determined during receive processing.

FIG. 21 is a flow diagram 2100 depicting a transmit processing sequence given metrics determined during receive processing. In FIG. 21 at operation 2102, the metrics are converted into a transmit frequency offset that is used for transmit AFC rotation, transmit time tracking, and a spreading factor selection. In an operation 2104, a transmitter waits until a next transmit fast slot. In an operation 2106, transmit occurs at the next transmit fast slot. Finally, in operation 2108, the transmitter returns to sleep. Where there is no subsequent transmit, the transmitter sleeps until operation 2000 in FIG. 20 is next scheduled.

Figure 22:
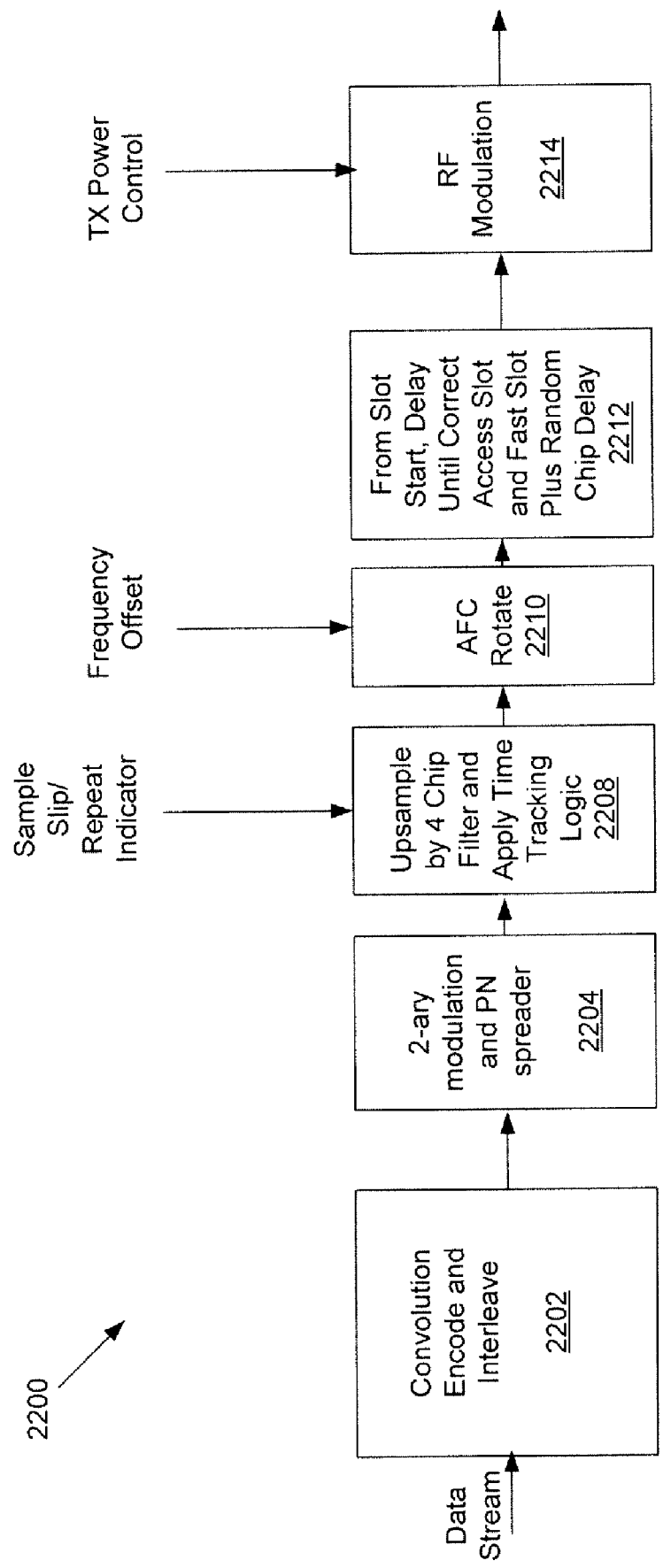
FIG. 22 is a block diagram illustrating a node's transmitter, including apparatus for adapting a transmit power based on received power.

FIG. 22 is a block diagram illustrating a node's transmitter 2200, including apparatus for adapting a transmit power based on received power. An incoming data stream is processed through a convolution encoder 2202. An output of convolution encoder 2202 is 2-ary modulated and spread in block 2204. Block 2204 may take as input a selected spreading factor. The spreading factor can be a member of the set {64, 128, 256, . . . , 8192} or may be some other value. Selection of a spreading factor may occur when a doppler phase error has been detected in a receiver. The spreading factor may be chosen to minimize probable doppler phase errors that may occur in a transmitted signal. Other modulation schemes are possible as well. At block 2208, a data stream is upsampled by a 4× oversample filter and time tracking logic is used to ensure that all frames of the data stream land at a sample rate consistent with a frequency reference of an access point. Block 2208 receives a sample slip/repeat indicator as an input. At block 2210, an automatic frequency control (AFC) rotation is performed including a frequency offset to match a combination of the node and access point's total frequency offset, ensuring that all frames from all of the nodes land near zero frequency offset. At block 2212, a delay is imposed from a start slot until a correct uplink random delay block and fast slot occurs. This includes both a delay to align a transmission with a correct fast slot and a random delay. The random delay may include picking a random starting symbol to begin transmission on, possibly picked from unused symbols that are symmetrical to downlink preamble symbols. The random delay may also include a random offset into the correct random delay block. These techniques improve a probability that a signal transmitted by the node will be quasi-orthogonal to any other simultaneous transmissions. A large range of possible randomly selected chip offsets increases a probability that a particular frame will not collide (or, in other words, have an identical chip timing at an access point) with another frame from another transmitter. Finally in block 2214 the data stream is modulated to radio frequency and power controlled using a transmit power control input. A transmission may be aborted when a received power measurement indicates that a different transmit power is required. The transmission may be repeated at a new power setting. This block 2214 allows for open loop power control based on received power characteristics of a downlink signal.

Figure 23:
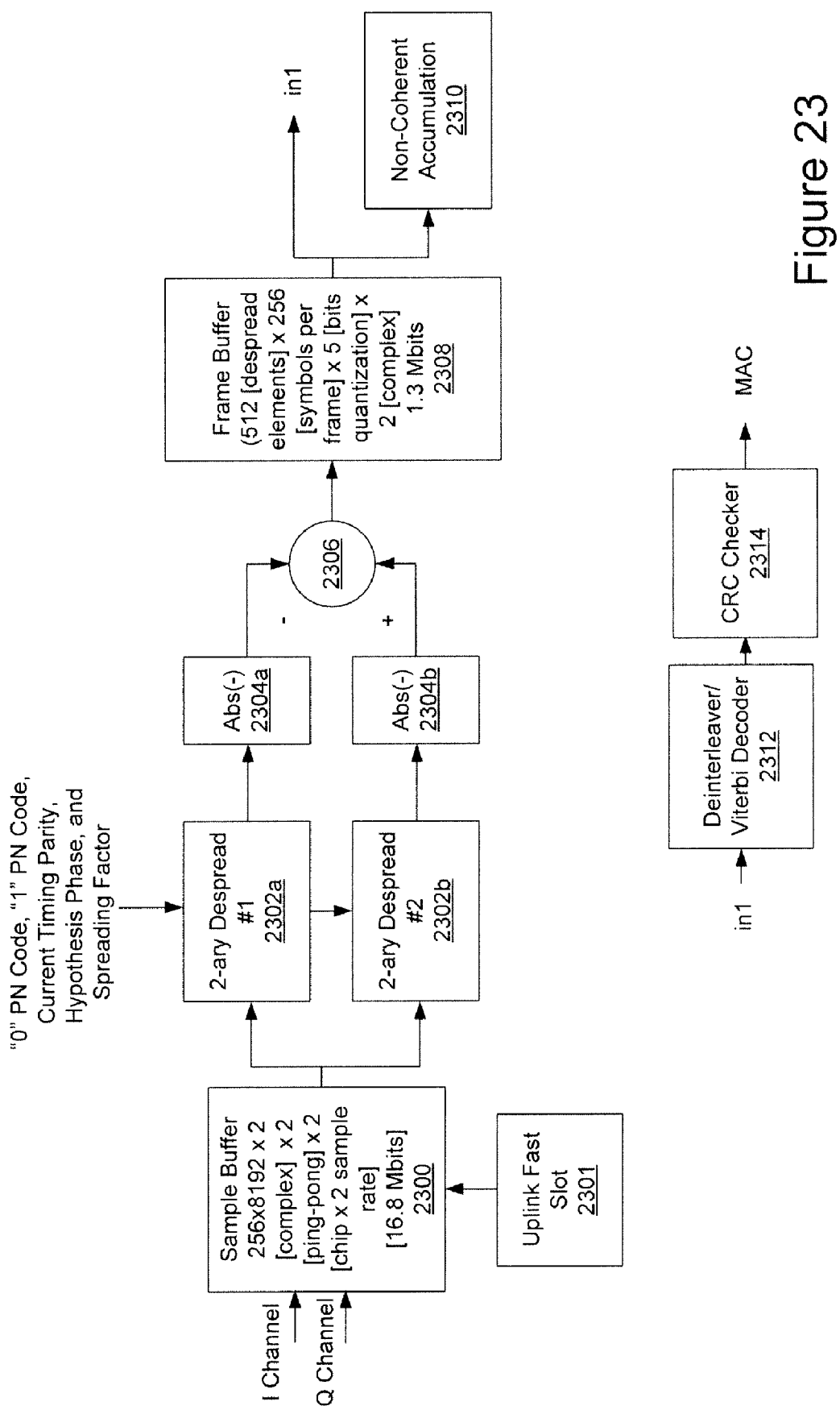
FIG. 23 depicts an access point (AP) receive data path.

FIG. 23 depicts an access point (AP) receive data path. Unlike the node, an entire frame at the largest spreading factor may be stored in a ping-pong buffer scheme in a sample buffer 2300. This buffer scheme may use a substantial amount of memory (e.g., 16.8 Mbits) and in at least one embodiment, it may be stored in a dedicated off-chip memory device. The sample buffer block 2300 includes representative values. In alternative embodiments, other values may be used. Unlike the tag, the time tracking logic and the AFC rotation logic may not need to be used since the AP can be the master time reference. An uplink fast slot input 2301 to the sample buffer 2300 ensures the sample buffer 2300 is filled during uplink fast slots by an access point receiver. The timing of the uplink fast slot input 2301 is such that the sample buffer 2300 is active during RPMA delay blocks that are not idle and during uplink fast slots. The sample buffer 2300 passes frames to 2-ary despread array 2302a and 2302b. The 2-ary despread arrays 2302a and 2302b use the orthogonal or quasi-orthogonal bit streams used by the node in modulating the signal. The bit streams may consist of a "0" PN code and a "1" PN code. The 2-ary despread arrays 2302a and 2302b may also receive current timing parity (which may be chip×2 resolution only), hypothesis phase, and/or spreading factor as inputs. The 2-ary despread arrays 2302a and 2302b shown may be implemented either as two separate despread arrays or may be implemented as a single despread array that iteratively checks a "0" PN code and a "1" PN code.

After despreading in the 2-ary despreaders 2302a and 2302b, the absolute value of each output is taken in abs 2304a and 2304b. At combiner 2306 one despread data stream from abs 2304a is subtracted from the other despread data stream from abs 2304b. The result is placed into a frame buffer 2308. The frame buffer 2308 output may be sent to a non-coherent accumulation block 2310 to determine an SNR metric such as signal strength for use in transmission power-control feedback to the tag. The frame buffer 2308 output may also be sent to a deinterleaver/viterbi decoder 2312 and subsequently checked for a correct cyclic redundancy code in CRC checker 2314. All payloads with valid CRCs are passed up to the AP's media access control layer. This process is described further in FIG. 24.

Figure 24:
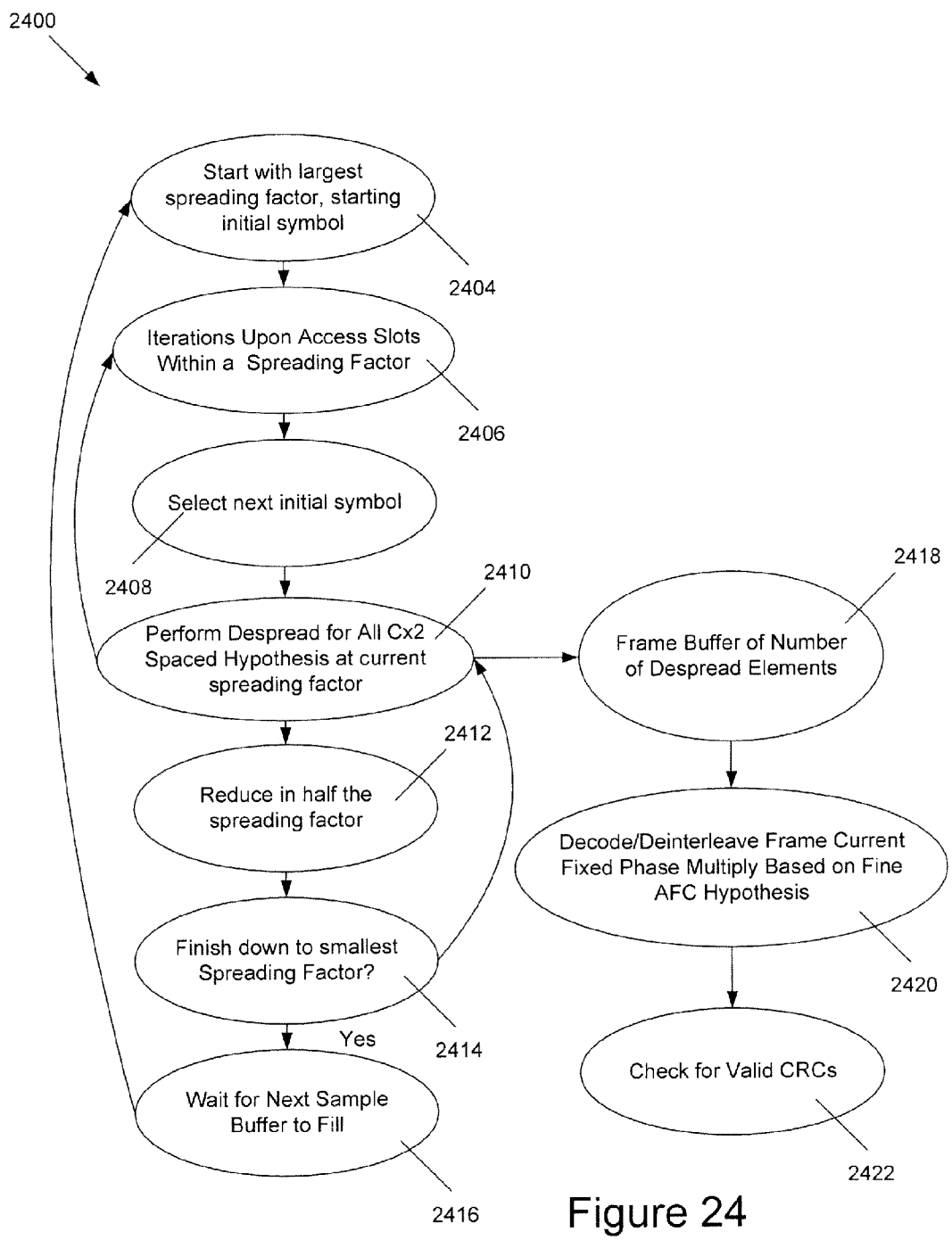
FIG. 24 is a flow diagram illustrating a use of receiver hardware on an access point to receive a node's broadcast while skipping over the access point's transmit fast slots in a frame buffer.

FIG. 24 is a flow diagram 2400 illustrating a use of receiver hardware on an access point to receive a node's broadcast while skipping over the access point's transmit fast slots in a frame buffer. The access point receives the node's transmissions with similar receiver hardware to that in the node. The flow diagram 2400 of FIG. 24 illustrates a search of a multi-dimensional space for receive parameters. The search shows an example of an ordering of iterating upon all possible chip×2 timing offsets, spreading factors from a set of possible spreading factors, and access slot numbers for spreading factors less than a maximum. First, scanning mode is entered in flow diagram 2400 with a selection of a coarse AFC value. The access point initializes a spreading factor to a largest spreading factor and a symbol to a starting initial symbol in block 2404. Each access slot within the spreading factor is selected in block 2406. An appropriate symbol is selected in block 2408. Reception may begin on any of a number of different symbols in order to increase RPMA space available. Thus, the access point scans through each symbol by selecting each symbol in block 2408. Block 2410 performs a despread operation on the symbol and passes on to frame buffer despread elements in operation 2418. The spreading factor is reduced in operation 2412. If the spreading factor has not reached a smallest spreading factor, then the access point loops to the despread operation 2410 with a smaller spreading factor. If the access point has searched the smallest spreading factor, then the access point waits for a next sample buffer to fill in operation 2416 and then loops to operation 2404. Meanwhile, a frame of the frame buffer despread elements of block 2418 are decoded and deinterleaved based on a fine AFC hypothesis in operation 2420. As a final step, the access point checks the decoded and deinterleaved frame for a valid CRC in operation 2422. When a valid CRC is found, the frame and the receive parameters are sent to a MAC layer.

Figure 25:
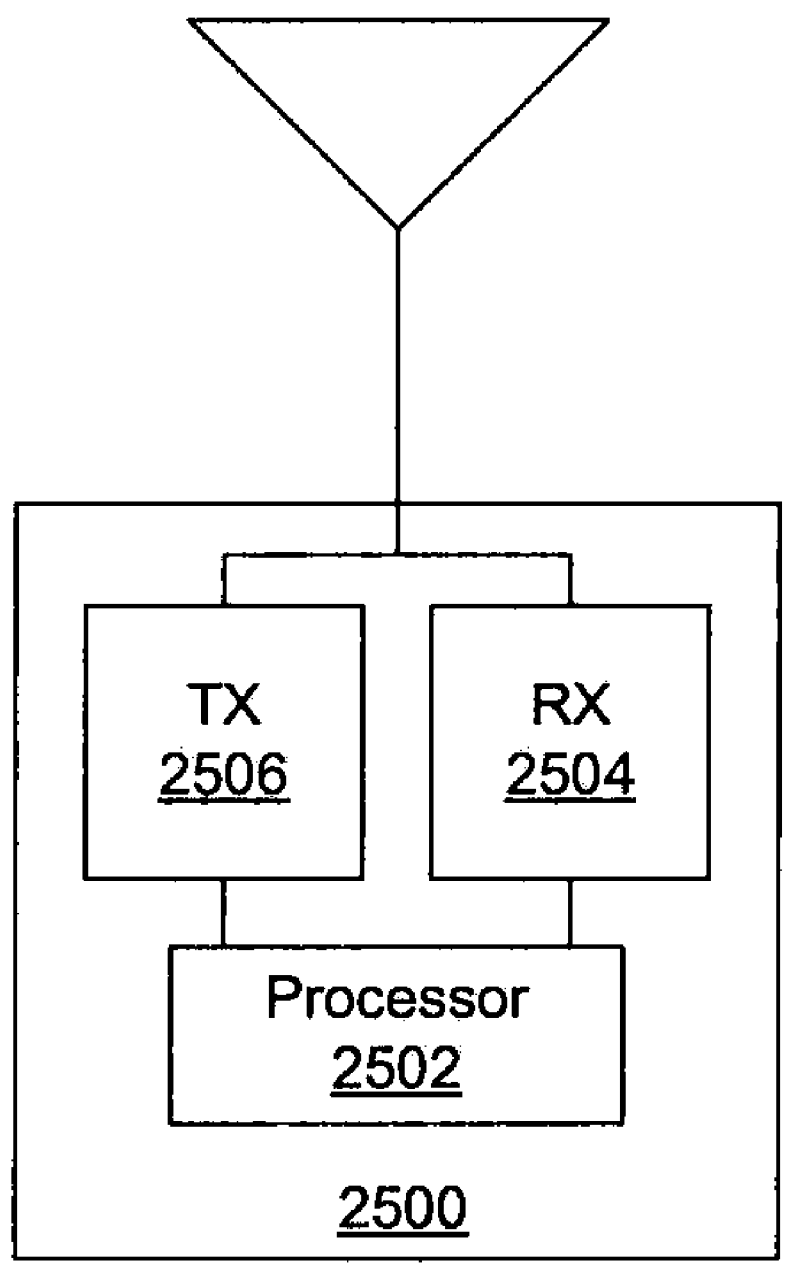
FIG. 25 is a block diagram illustrating a device of the spread spectrum communication system.

The method of communication described above may be implemented in a spread spectrum communication system. The method of receiving a signal, controlling power, and compensating for doppler phase errors may be implemented on all devices of a system, including nodes, access points and any other device communicating in the system. FIG. 25 shows an example of a device of the system. Each device 2400 of the system, including nodes, access points and any other device communicating in the system, may contain a processor 2402, a receiver 2404, and a transmitter 2406. The processor 2402 may be composed of a general purpose processor or implementation specific logic circuits designed to implement methods described above. The receiver 2404 may be configured to receive spread spectrum communication that may include a random timing offset. The corresponding transmitter 2406 on communicating devices may transmit the spread spectrum communication, also possibly including the random timing offset. The processor or other controlling logic on the receiving device may then perform the operations described herein to improve reception and to improve transmission methods and power control. The processor 2402 may be directed based on software instructions stored on a computer readable medium.

The foregoing description of representative embodiments has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated. The processes used in the uplink are not constrained to the uplink and could also be applied to the downlink. Similarly, the processes used in the downlink are not constrained to the downlink and could also be applied to the uplink. In addition, one or more flow diagrams were used herein. The use of flow diagrams is not intended to be limiting with respect to the order in which operations are performed.

What is claimed is:

1. A method for power control in a half-duplex, multiple access spread spectrum communication interface comprising:

receiving a first fast slot of a first frame at a first time at a receiver, wherein the frame is divided into a plurality of fast slots;

measuring a first received power based on receiving the first fast slot;

transmitting a second fast slot of a second frame at a second time at a power setting at a transmitter
wherein the second frame is divided into a second plurality of fast slots,
wherein a number of fast slots in the second plurality of fast slots is determined in part from a variable spreading factor,
wherein the power setting is determined in part from the first received power, and
wherein the variable spreading factor is determined in part from the first received power.

2. The method of claim 1, wherein the second frame is spread using a PN code that also spreads a transmission by a second transmitter, and wherein the receiver and the transmitter are on a node.

3. The method of claim 1, wherein the second time is less than or equal to 2.048 milliseconds after the second time.

4. The method of claim 1, wherein each fast slot of the plurality of fast slots is smaller than a symbol.

5. The method of claim 1, wherein each fast slot of the plurality of fast slots contains a plurality of symbols.

6. The method of claim 1, wherein the second time comprises a random time offset.

7. The method of claim 1, wherein the first time comprises a random time offset.

8. The method of claim 1, wherein the first frame and the second frame are modulated using 2-ary modulation.

9. The method of claim 1, further comprising aborting a prior transmission after measuring the received power.

10. The method of claim 9, wherein the second frame is a repeat of the prior transmission.

11. The method of claim 1, wherein a number of fast slots in the second plurality of fast slots is determined in part from a constant frame size.

12. The method of claim 1, wherein at least a portion of the second fast slot overlaps at least a portion of a third fast slot in a slot which is transmitted by a second transmitter such that the second fast slot and the third fast slot can be received.

13. A node capable of controlling transmit power in a half-duplex, multiple access spread spectrum communication system comprising:

a receiver configured to receive a first fast slot of a first frame at a first time, wherein the first frame is divided into a first plurality of fast slots and to measure a first received power based on receiving the first fast slot;

a transmitter configured to transmit a second fast slot of a second frame at a second time at a power setting wherein the second frame is divided into a second plurality of fast slots, wherein a number of fast slots in the second plurality of fast slots is determined in part from a variable spreading factor;

a processor configured to adjust the power setting as determined in part from the first received power and to adjust the variable spreading factor as determined in part from the first received power.

14. The node of claim 13, wherein the second frame is spread using a PN code that also spreads a transmission by a second transmitter, and wherein the receiver and the transmitter are on a node.

15. The node of claim 13, wherein the second time is less than or equal to 2.048 after the second time.

16. The node of claim 13, wherein each fast slot of the plurality of fast slots is smaller than a symbol.

17. The node of claim 13, wherein the second time comprises a random time offset.

18. The node of claim 13, wherein the first frame and the second frame are modulated using 2-ary modulation.

19. The node of claim 13, wherein the processor is further configured to abort a prior transmission after the first received power is measured.

20. A non-transitory computer-readable medium having computer-readable instructions stored thereon that, upon execution by a processor, cause a node to:

receive a first fast slot of a frame at a first time at a receiver, wherein the frame is divided into a first plurality of fast slots;

measure a first received power based on receiving the first fast slot;

adjust a power setting as determined in part from the first received power;

adjust a variable spreading factor as determined in part from the first received power; and transmit a second fast slot of a second frame at a second time at the power setting wherein the second frame is divided into a second plurality of fast slots and wherein a number of fast slots in the second plurality of fast slots is determined in part from the variable spreading factor.

* * * * *